(12) United States Patent
Darnell et al.

(10) Patent No.: US 10,948,557 B2
(45) Date of Patent: Mar. 16, 2021

(54) MRI RF COIL ASSEMBLIES WITH RF COIL ELEMENTS THAT ALLOW WIRELESS COMMUNICATION DATA TRANSMISSION AND RELATED METHODS AND SYSTEMS

(71) Applicant: Duke University, Durham, NC (US)

(72) Inventors: Dean Darnell, Chapel Hill, NC (US);
Allen W. Song, Chapel Hill, NC (US);
Trong-Kha Truong, Cary, NC (US)

(73) Assignee: Duke University, Durham, NC (US)

( * ) Notice: Subject to any disclaimer, the term of this patent is extended or adjusted under 35 U.S.C. 154(b) by 0 days.

(21) Appl. No.: 16/489,862

(22) PCT Filed: Mar. 20, 2018

(86) PCT No.: PCT/US2018/023259
§ 371 (c)(1),
(2) Date: Aug. 29, 2019

(87) PCT Pub. No.: WO2018/183035
PCT Pub. Date: Oct. 4, 2018

(65) Prior Publication Data
US 2020/0033429 A1    Jan. 30, 2020

Related U.S. Application Data

(60) Provisional application No. 62/479,457, filed on Mar. 31, 2017.

(51) Int. Cl.
| | | |
|---|---|---|
| *G01R 33/36* | (2006.01) | |
| *G01R 33/34* | (2006.01) | |
| *H02J 7/02* | (2016.01) | |

(52) U.S. Cl.
CPC ... *G01R 33/3692* (2013.01); *G01R 33/34046* (2013.01); *G01R 33/3621* (2013.01); *G01R 33/3635* (2013.01); *H02J 7/025* (2013.01)

(58) Field of Classification Search
CPC .......... G01R 33/3692; G01R 33/34046; G01R 33/3621; G01R 33/3635; H02J 7/025
See application file for complete search history.

(56) References Cited

U.S. PATENT DOCUMENTS

| | | |
|---|---|---|
| 7,598,739 B2 | 10/2009 | Vaughan, Jr. et al. |
| 7,800,368 B2 | 9/2010 | Vaughan et al. |

(Continued)

FOREIGN PATENT DOCUMENTS

| | | |
|---|---|---|
| WO | 2014003918 | 1/2014 |

OTHER PUBLICATIONS

Aggarwal et al. "A Wireless MRI system using mm-Wave Transmission" The Proceedings of the International Society of Magnetic Resonance in Medicine, program No. 0545 (3 pages) (2016).

(Continued)

*Primary Examiner* — G. M. A Hyder
(74) *Attorney, Agent, or Firm* — Myers Bigel, P.A.

(57) ABSTRACT

RF coil array assemblies include an RF coil array with a plurality of coil elements. The coil elements each have an RF conductor that defines an RF path. The coil elements operate in an RF mode for at least one of transmitting RF excitation signals or receiving MRI image signals on the RF conductors. The RF coil array assemblies also include at least one wireless module connected to the RF coil array, the at least one wireless module including a wireless transceiver operative at a wireless communication frequency band and attached to at least some of the coil elements to provide input and output signals to the at least one wireless module. At least some of the coil elements can concurrently transmit or receive wireless communication data and the RF excitation signals or the received MRI image signals.

34 Claims, 19 Drawing Sheets
(1 of 19 Drawing Sheet(s) Filed in Color)

(56) References Cited

U.S. PATENT DOCUMENTS

| | | | |
|---|---|---|---|
| 9,568,572 B2* | 2/2017 | Vaughan | G01R 33/3692 |
| 9,864,025 B2 | 1/2018 | Han et al. | |
| 2008/0272786 A1 | 11/2008 | Luedeke et al. | |
| 2008/0275332 A1 | 11/2008 | Alradady et al. | |
| 2009/0237077 A1 | 9/2009 | Vaughan | |
| 2012/0062230 A1 | 3/2012 | Vaughan, Jr. et al. | |
| 2014/0111202 A1 | 4/2014 | Wald et al. | |
| 2014/0183269 A1* | 7/2014 | Glaser | G06Q 20/34 |
| | | | 235/492 |
| 2015/0177343 A1 | 6/2015 | Wald et al. | |
| 2016/0116556 A1 | 4/2016 | Darnell et al. | |
| 2016/0335862 A1* | 11/2016 | Jaber | H04W 4/80 |
| 2017/0026780 A1 | 1/2017 | Ryu | |

OTHER PUBLICATIONS

Aggarwal et al. "A Millimeter-Wave Digital Link for Wireless MRI" IEEE Transactions on Medical Imaging, 36(2):574-583 (2017).

Barmet et al. "Spatiotemporal Magnetic Field Monitoring for MR" Magnetic Resonance in Medicine, 60:187-197 (2008).

Bernstein et al. "Imaging Artifacts at 3.0T" Journal of Magnetic Resonance Imaging, 24:735-746 (2006).

Blamire, AM "The technology of MRI—the next 10 years?" The British Journal of Radiology, 81(968):601-617 (2008).

Bulumulla et al. "Inductively coupled wireless RF coil arrays" Magnetic Resonance Imaging, 33(3):351-357 (2015).

De Graaf et al. "Dynamic shim updating (DSU) for multislice signal acquisition" Magnetic Resonance in Medicine, 49(3):409-416 (2003).

Golay, Marcel J. E. "Field Homogenizing Coils for Nuclear Spin Resonance Instrumentation" The Review of Scientific Instruments, 29(4):313-315 (1958).

Graessl et al. "Design, Evaluation and Application of a Modular 32 Channel Transmit/Receive Surface Coil Array for Cardiac MRI at 7T" Proceedings of the International Society of Magnetic Resonance in Medicine (ISMRM) 20th Annual Meeting, Melbourne, p. 305 (2012).

Heid et al. "Cutting the Cord—Wireless Coils for MRI" Proceedings of the International Society of Magnetic Resonance in Medicine (ISMRM) 17, p. 100 (2009).

Juchem et al. "Magnetic Field Modeling with a Set of Individual Localized Coils" Journal of Magnetic Resonance, 204(2):281-289 (2010).

Juchem et al. "Dynamic Multi-Coil Shimming of the Human Brain at 7 Tesla" Journal of Magnetic Resonance, 212(2):280-288 (2011).

Juchem et al. "Multi-Coil Shimming of the Mouse Brain" Magnetic Resonance in Medicine, 66(3):893-900 (2011).

Koch et al. "Optimization of static magnetic field homogeneity in the human and animal brain in vivo" Progress in Nuclear Magnetic Resonance Spectroscopy, 54(2):69-96 (2009).

Kraff et al. "An eight-channel transmit/receive multipurpose coil for musculoskeletal MR imaging at 7 T" Medical Physics, 37(12):6368-6376 (2010).

Maclaren et al. "Prospective Motion Correction in Brain Imaging: A Review" Magnetic Resonance in Medicine, 69:621-636 (2013).

Romeo et al. "Magnet field profiling: analysis and correcting coil design" Magnetic Resonance in Medicine, 1(1):44-65 (1984).

Setsompop et al. "Parallel RF Transmission With Eight Channels at 3 Tesla" Magnetic Resonance in Medicine, 56:1163-1171 (2006).

Truong et al. "Integrated RF/shim coil array for parallel reception and localized B0 shimming in the human brain" NeuroImage, 103:235-240 (2014).

Vaughan et al. "9.4T Human MRI: Preliminary Results" Magnetic Resonance in Medicine, 56(6):1274-1282 (2006).

Wei et al. "Digital Wireless Transmission for MRI Signals" Proceedings of the International Society of Magnetic Resonance in Medicine (ISMRM) 15, p. 1001 (2007).

Wei et al. "A realization of digital wireless transmission for MRI signals based on 802.11b" Journal of Magnetic Resonance, 186:358-363 (2007).

Wiggins et al. "32-Channel 3 Tesla Receive-Only Phased-Array Head Coil With Soccer-Ball Element Geometry" Magnetic Resonance in Medicine, 56:216-223 (2006).

Wilson et al. "Optimization of static field homogeneity in human brain using diamagnetic passive shims" Magnetic Resonance in Medicine, 48(5):906-914 (2002).

International Search Report and the Written Opinion of the International Searching Authority corresponding to International Patent Application No. PCT/US2018/023259 (13 pages) (dated Aug. 1, 2018).

* cited by examiner

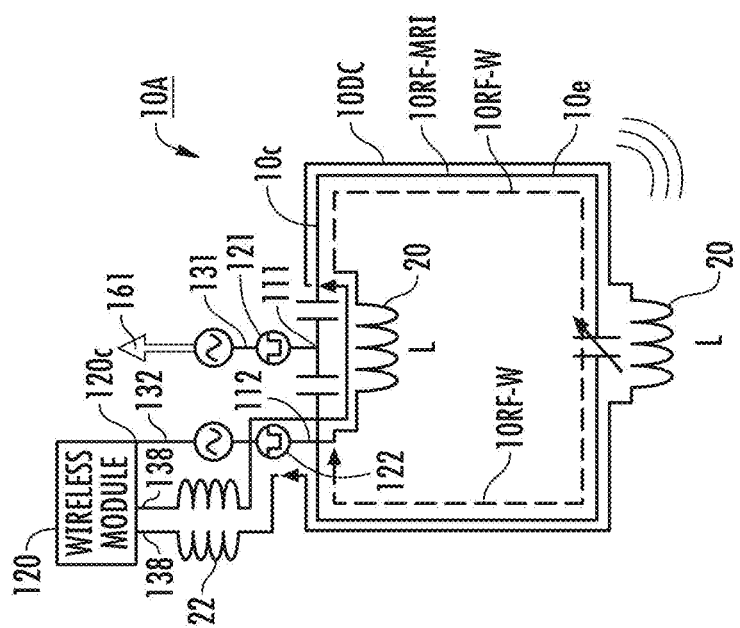
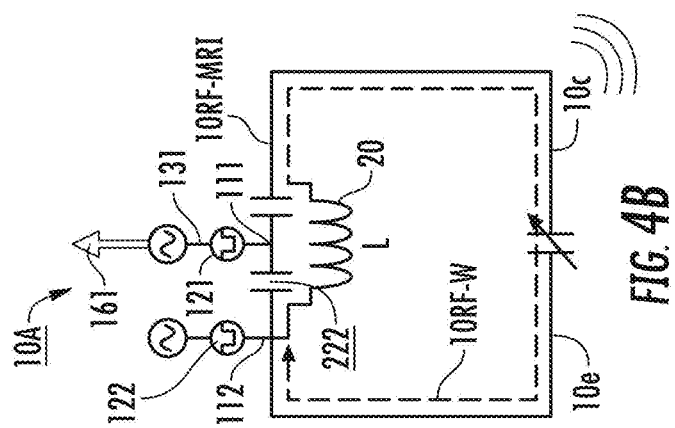
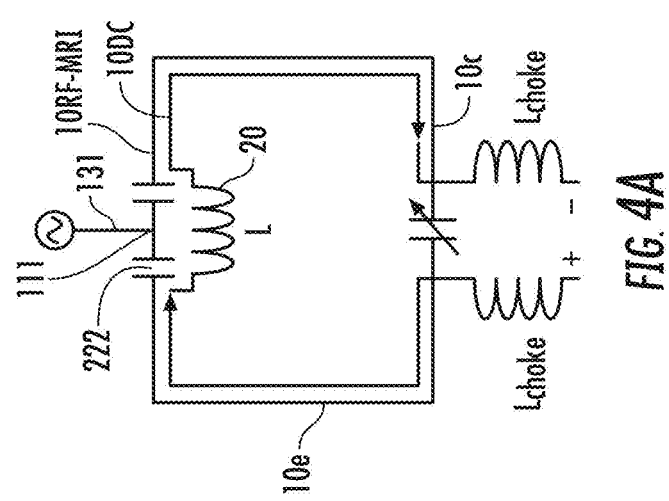
FIG. 4C
FIG. 4B
FIG. 4A

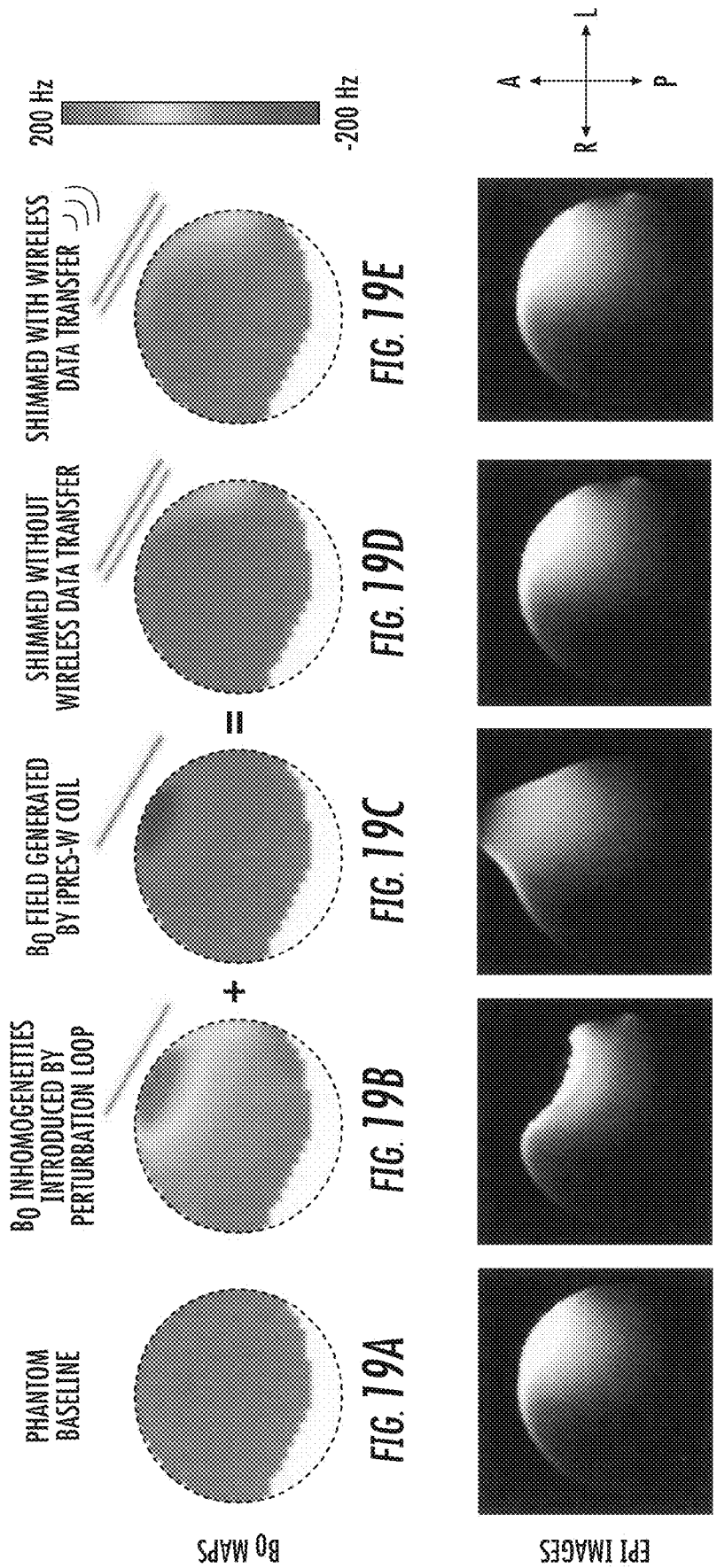

MRI RF COIL ASSEMBLIES WITH RF COIL ELEMENTS THAT ALLOW WIRELESS COMMUNICATION DATA TRANSMISSION AND RELATED METHODS AND SYSTEMS

RELATED APPLICATIONS

This application is a 35 USC § 371 national stage application of Patent Application No. PCT/US2018/023259, filed Mar. 20, 2018, which claims the benefit of and priority to U.S. Provisional Application Ser. No. 62/479,457, filed Mar. 31, 2017, the contents of which are hereby incorporated by reference as if recited in full herein.

FIELD OF THE INVENTION

This invention relates to Magnetic Resonance Imaging.

BACKGROUND

Major developments in magnetic resonance imaging (MRI) technology have been driven by the ever increasing demand for higher static magnetic field ($B_0$) strengths. This increase, however, has posed many technical challenges, most notably the exacerbated inhomogeneity in both the main magnetic field ($B_0$) and the radiofrequency (RF) magnetic field ($B_1$). See, e.g., Blamire A M. The technology of MRI—the next 10 years? Brit J Radiol 2008; 81: 601-617; and Bernstein M A, Huston J, Ward H A. Imaging artifacts at 3.0 T. J Magn Reson Imaging 2006; 24:735-746.

A homogeneous $B_1$ field can be required to ensure a uniform excitation across the sample. Recent advances in parallel excitation (also known as parallel transmit) technology have provided an effective means to address this issue by using a process termed "RF" or "$B_1$" shimming, in which the amplitude, phase, timing, and frequency of the RF current in each coil element are independently adjusted. See, e.g., Vaughan T, DelaBarre L, Snyder C, Tian J F, Akgun C, Shrivastava D, et al. 9.4 T human MRI: preliminary results. Magn Reson Med 2006; 56:1274-1282; and Setsompop K, Wald L L, Alagappan V, Gagoski B, Hebrank F, Fontius U, Schmitt F, Adalsteinsson E. Parallel R F transmission with eight channels at 3 Tesla. Magn Reson Med 2006; 56:1163-1171. See also, U.S. Pat. Nos. 7,598,739 and 7,800,368, the contents of which are hereby incorporated by reference as if recited in full herein.

A homogeneous $B_0$ field is required to ensure a correct spatial representation of the imaged object. Homogenization of the magnetic field distribution (i.e., $B_0$ shimming) is often a difficult task when strong localized $B_0$ inhomogeneities are present. See, e.g., Koch K M, Rothman D L, de Graaf R A. Optimization of static magnetic field homogeneity in the human and animal brain in vivo. Prog Nucl Magn Reson Spectrosc 2009; 54:69-96.

Passive shimming, which relies on the optimal arrangement of magnetized materials, is limited by the often tedious work required and the lack of flexibility in subject-specific conditions. See, Wilson J L, Jenkinson M, Jezzard P. Optimization of static field homogeneity in human brain using diamagnetic passive shims. Magn Reson Med 2002; 48:906-914.

On the other hand, active shimming, which utilizes continuously adjustable electromagnets, is the most widely used shimming method and typically employs spherical harmonic (SH) coils, including the ability to provide dynamic shimming. See, Golay M J, Field homogenizing coils for nuclear spin resonance instrumentation. Rev Sci Instrum 1958; 29:313-315; and Romeo F, Hoult D I. Magnet field profiling: analysis and correcting coil design. Magn Reson Med 1984; 1:44-65. And de Graaf R A, Brown P B, McIntyre S, Rothman D L, Nixon T. Dynamic shim updating (DSU) for multislice signal acquisition. Magn Reson Med 2003; 49:409-416. The contents of these documents are hereby incorporated by reference as if recited in full herein.

In practice, however, SH shimming often cannot effectively correct for high-order localized field distortions because the required number of coils increases dramatically with the SH order. See, Golay M J, Field homogenizing coils for nuclear spin resonance instrumentation, Rev Sci Instrum 1958; 29:313-315. As such, it is typically limited to the second or third order.

Recently, Juchem et al. have proposed a multi-coil modeling and shimming method, in which a large number of small, localized electrical coils are used to shape the $B_0$ field by independently adjusting the direct current (DC) in each coil, thus achieving an improved performance relative to SH shimming. However, it requires a separate set of shim coils adjacent to the RF coil array, which takes a considerable space within the constricted space between the subject and the magnet bore. In addition, when the shim coil array is placed within the RF coil array, a large gap needs to be kept open in the middle of the shim coil array to allow RF penetration and reduce the electromagnetic interference between the RF and shim coil arrays (i.e., RF damping), which reduces the flexibility and performance of the shimming. See, e.g., Juchem C, Nixon T W, McIntyre S, Rothman D L, de Graaf R A. Magnetic field modeling with a set of individual localized coils. J Magn Reson 2010; 204:281-289; Juchem C, Brown P B, Nixon T W, McIntyre S, Rothman D L, de Graaf R A. Multi-coil shimming of the mouse brain. Magn Reson Med 2011; 66:893-900; and Juchem C, Brown P B, Nixon T W, McIntyre S, Boer V O, Rothman D L, de Graaf R A. Dynamic multi-coil shimming of the human brain at 7 T. J Magn Reson 2011; 212:280-288. The contents of these documents are hereby incorporated by reference as if recited in full herein.

Data transfer between 1) the MRI scanner or peripheral systems (e.g., sensors) located inside the scanner room and 2) the MRI console or auxiliary computers located outside the scanner room can be important to its operation. For example, data is transferred: to acquire MRI data, to obtain information from sensors for physiological monitoring (i.e. heartbeat and breathing), from a camera for motion tracking, or from NMR probes for far field monitoring, to present visual, auditory, or somatosensory stimuli to, or record responses from, subjects during functional MRI, to perform localized $B_0$ shimming, or to detune a radio-frequency (RF) receive coil array during pulse sequence RF transmit periods. Currently, the data is transferred through a network of wired connections, which can add significant complexity to the system.

Recently, in an effort to reduce the number of wired connections and connectors, prototype receive coil arrays have been proposed to perform wireless data transfer between the RF coil array and the scanner. See, e.g., Aggarwal, K et al. Proc ISMRM 2016; 24:545; Aggarwal, K et al. IEEE Trans Med Imaging 2016; DOI: 10.1109/TMI.2016.2622251; and Bulumulla, S. B et al. MRI 2015; 33:351-357, the contents of which are hereby incorporated by reference as if recited in full herein. However, these solutions require additional dipole antennas or antenna arrays or "sniffer" coils to be added onto the coil array and inside the scanner bore to support wireless data transfer within the scanner.

Summary of Embodiments the Invention

Embodiments of the invention provide wireless communications in an MRI scanner that can reduce the complexity of the scanner by decreasing the number of wired connections and connectors and without requiring complex additional components or modifications to existing MRI hardware.

Embodiments of the invention are directed at RF coil designs that allow RF currents at both Larmor and wireless data frequencies to flow on the same coil element, which can allow simultaneous MRI image acquisition and wireless data transmission with the same coil.

The RF coil arrays can have coil elements with closed conductor paths with at least one inductor associated with at least one parallel inductor capacitor (LC) resonant circuit with a high resonant frequency. DC current flows through the at least one inductor of the at least one LC resonant circuit.

Embodiments of the invention contemplate that the DC mode of RF coils may be useful for spatial encoding.

Embodiments of the invention are directed to a Radio Frequency (RF) coil assembly for an MRI system. The assembly includes an RF coil array comprising a plurality of coil elements, the coil elements each comprising an RF conductor that defines an RF path. The coil elements are configured to operate in an RF mode for at least one of transmitting RF excitation signals or receiving MRI image signals on the RF conductors. The assembly also includes at least one wireless module coupled to the RF coil array. The at least one wireless module has a wireless transceiver that is configured to operate in a wireless communication frequency band. The at least one wireless module provides input signals and/or output signals to and/or from at least one of the coil elements. The wireless transceiver is configured to provide input signals and/or output signals to and/or from the at least one of the coil elements such that the at least one coil element resonates at one or more resonant frequencies in the wireless communication frequency band when excited by the input signals and/or output signals The transceiver can have at least one antenna input connection and a plurality of general input and output connections. The antenna input connection can be coupled to the at least one coil element that resonates in the wireless communication frequency band.

The wireless transceiver can provide input and output signals to a plurality of the coil elements. The RF coil assembly can also include first bandstop filters coupled to respective ones of the coil elements providing the input signals and/or the output signals. A respective first bandstop filter can reside between a corresponding coil element and the at least one wireless module adjacent a perimeter (phase plane) of the corresponding coil element. The first bandstop filters can provide an open electrical circuit at a Larmor frequency.

The wireless transceiver can provide input and output signals to a plurality of the coil elements. The RF coil assembly can also include first and second bandstop filters attached to the coil elements that resonant in the wireless communication frequency band. The second bandstop filters can provide an impedance that is matched to a pre-amplifier impedance of a pre-amplifier connected to a respective coil element at a first RF connection associated with an MRI feed port at the Larmor frequency. The first bandstop filters can provide a high impedance at an operational frequency of the second bandstop filter at a second RF connection associated with a wireless data feed port at the wireless communication frequency band.

The transceiver can include a plurality of general purpose input and output connections that can be coupled to at least some of the coil elements and that can provide a control signal for peripheral devices as one or more input signal of the input signals.

The at least one wireless module can include a plurality of general purpose input and output connections that can be coupled to a direct current (DC) power supply and at least some of the coil elements for providing DC current for B0 shimming.

The at least one wireless module can be a single wireless module with a single transceiver coupled to the RF coil elements of the RF coil array.

A number of the plurality of coil elements of the RF coil array can be in a range from 2 to 512.

The at least one wireless module can be a plurality of wireless modules, each comprising a respective transceiver. Different transceivers can be coupled to different subsets of the coil elements.

The at least one wireless module can be a plurality of wireless modules with respective transceivers, one for each coil element.

The RF coil assembly can further include a battery module with a plurality of rechargeable non-ferromagnetic batteries connected to the wireless module and the RF coil elements. At least some of the RF conductors of the coil elements can be configured to generate one or more direct current (DC) loops.

The at least one wireless module that provides the input signals and/or the output signals to and/or from at least one of the coil elements can be coupled to a plurality of different coil elements. The different coil elements can be resonant elements in the wireless frequency band and define a Multiple Input, Multiple Output configuration.

The coil elements that provide the input signals can be different from the coil elements that provide the output signals.

At least some of the coil elements can include a switch to adaptively adjust a number of DC loops within a respective coil element. The coil elements with the switch can be electrically connected to general input and general output (GPIO) connections of the transceiver of the wireless module.

The transceiver of the at least one wireless module can include a plurality of general purpose input and output ports. One or more of the general purpose input and output ports can be connected to a DC power supply and one or more of the coil elements to thereby provide a DC control voltage and/or DC shimming current to those coil elements.

The wireless transceiver can be an LTE or WiFi transceiver.

A first plurality of the coil elements can provide the input signals and a second different plurality of the coil elements can provide the output signals.

The wireless transceiver can include a 802.11b/g WiFi transceiver. The transceiver can include general purpose input output (GPIO) connections. A first plurality of coil elements can be input channels and wherein a second different plurality of the coil elements can be output channels.

The at least one wireless module can be a single wireless module with a single transceiver that is attached to the RF coil array.

The RF coil assembly can be coupled to a Magnetic Resonance Imaging (MRI) system with an MRI scanner with a magnetic field magnet in a scanner room of an MRI suite and at least one dipole antenna spaced apart from the at least one wireless module. The at least one dipole antenna is in communication with a wireless access point (WAP) and is coupled with the at least one wireless module.

The at least one dipole antenna can be in the scanner room and can be configured to directly receive the wireless data from the at least one wireless module of the RF coil array and transmit the wireless data through a filter to the WAP outside the scanner room.

Other embodiments are directed to methods of operating an Magnetic Resonance Imaging (MRI) system. The methods include: providing a Radio Frequency (RF) coil array assembly with a plurality of coil elements and at least one wireless module with a wireless transceiver with general input and output (GPIO) connections, the at least one wireless module connected to at least some of the coil elements; concurrently flowing RF currents at Larmor and wireless communication data transmission frequencies on at least some of the coil elements; and directly wirelessly transmitting MRI RF signal and wireless communication data from the wireless module to at least one dipole antenna that is outside a bore of a magnet in a scanner room of an MRI scanner suite.

The method can further include using one or more of the GPIO connections to wirelessly deliver a control signal to a peripheral device and/or a direct current power supply.

The method can further include electrically isolating first and second RF ports of at least some of the plurality of coil elements using first and second bandstop filters and connecting an antenna connection of the transceiver of the wireless module to at least some of the coil elements with a respective first bandstop filter positioned adjacent a perimeter (phase plane) of a respective RF coil element, between the coil element and the antenna connection of the transceiver.

The method can further include operating the RF coil assembly in at least one of an RF transmit or receive mode; flowing DC current through separate DC current loops of each respective coil element concurrently with the transmit or receive mode and the concurrently flowing of the RF currents at the Larmor and wireless data transmission frequencies and generating local $B_0$ magnetic fields in response to the flow of the DC current through the DC current loops, thereby $B_0$ shimming an imaging space of a magnet of the MR system using the generated local $B_0$ magnetic fields.

The method can also include transmitting a DC control input to a sensor or switch held by a respective coil element or the RF coil assembly using a GPIO connection of the transceiver of the wireless module.

The wireless transceiver of the wireless module can operate in a LTE or WiFi frequency band.

The method can further include providing DC current for generating the local B0 magnetic fields in the DC current loops from a battery module comprising rechargeable non-ferromagnetic batteries, at least some of the rechargeable non-ferromagnetic batteries in communication with GPIO connections of the wireless module.

A single wireless transceiver can communicate with a sub-set of the coil elements and the subset of coil elements can be connected to one or more antenna connections of the wireless transceiver. Each of the subset of coil elements can include a respective first bandstop filter positioned between the antenna connection and a perimeter (phase plane) of the coil element.

Yet other embodiments are directed to a battery module for an RF coil assembly. The battery module includes: a substrate; at least one rechargeable, non-ferromagnetic battery held on the substrate; and a wireless module comprising a transceiver held on the substrate electrically coupled to the at least one rechargeable battery.

The substrate can include a printed circuit board.

The at least one rechargeable, non-ferromagnetic battery can be a plurality of rechargeable batteries all electrically connected to the wireless module.

The wireless module can include at least one antenna connection and a plurality of general purpose input and output (GPIO) connections. At least some of the plurality of GPIO connections can be electrically connected to the rechargeable batteries.

The battery module can further include an electrical connection interface coupled to the wireless module and the rechargeable batteries. The electrical connection interface can be coupled to an external, non-ferromagnetic connector that comprises a plurality of DC power connections and at least one RF connection.

The battery module can include a plurality of switches in electrical communication with the GPIO connections and the rechargeable batteries.

The battery module can include a plurality of op amps, programmable resistors and a digital to analog converter held on the substrate in communication with the rechargeable batteries.

The battery module can be coupled to an RF coil assembly.

It is noted that aspects of the invention described with respect to one embodiment, may be incorporated in a different embodiment although not specifically described relative thereto. That is, all embodiments and/or features of any embodiment can be combined in any way and/or combination. Further, any feature or sub-feature claimed with respect to one claim may be included in another future claim without reservation and such shall be deemed supported in the claims as filed. Thus, for example, any feature claimed with respect to a method claim can be alternatively claimed as part of a system, circuit, computer readable program code or workstation. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

The foregoing and other objects and aspects of the present invention are explained in detail herein.

BRIEF DESCRIPTION OF THE DRAWINGS

The patent or application file contains at least one drawing executed in color. Copies of this patent or patent application publication with color drawings will be provided by the Office upon request and payment of the necessary fee.

FIG. 4A is a schematic illustration of an RF coil element with integrated parallel reception, excitation and Bo shimming capability according to embodiments of the present invention.

FIG. 4B is a schematic illustration of an RF coil element that allows RF currents at different frequencies to flow on the same coil element concurrently to perform MRI image signal reception and wireless data transfer at a different frequency band according to embodiments of the present invention.

FIG. 4C is a schematic illustration of an RF coil assembly with a wireless module and at least one RF coil element that allows RF currents at different frequencies to flow on the same coil element concurrently to perform MRI image signal reception and wireless data transfer at a different frequency band and that allows a DC current to flow on the same coil element concurrently with the RF currents for DC shimming according to embodiments of the present invention.

FIG. 17A are images acquired without data transfer and FIG. 17B are images obtained with the WiFi-enabled RF coil while data was transferred from the coil to an AP inside the scanner room.

FIG. 18B shows the wireless module activated during an MRI scan to illustrate remote wireless control of I/O ports.

FIGS. 19A-19E are B0 maps associated with different test conditions. FIG. 19A and FIG. 19B represent the baseline B0 map and the B0 inhomogeneities to be shimmed in a phantom, respectively. FIG. 19C is the B0 map corresponding to the magnetic field generated by the WiFi-enabled RF coil for shimming. FIG. 19D and FIG. 19E represent the B0 map after shimming has been performed (FIG. 19D) and after shimming has been performed while simultaneously transmitting wireless data (FIG. 19E).

FIGS. 19F-19J are corresponding EPI images of the B0 maps of FIGS. 19A-19E.

DETAILED DESCRIPTION

Figure 1A:
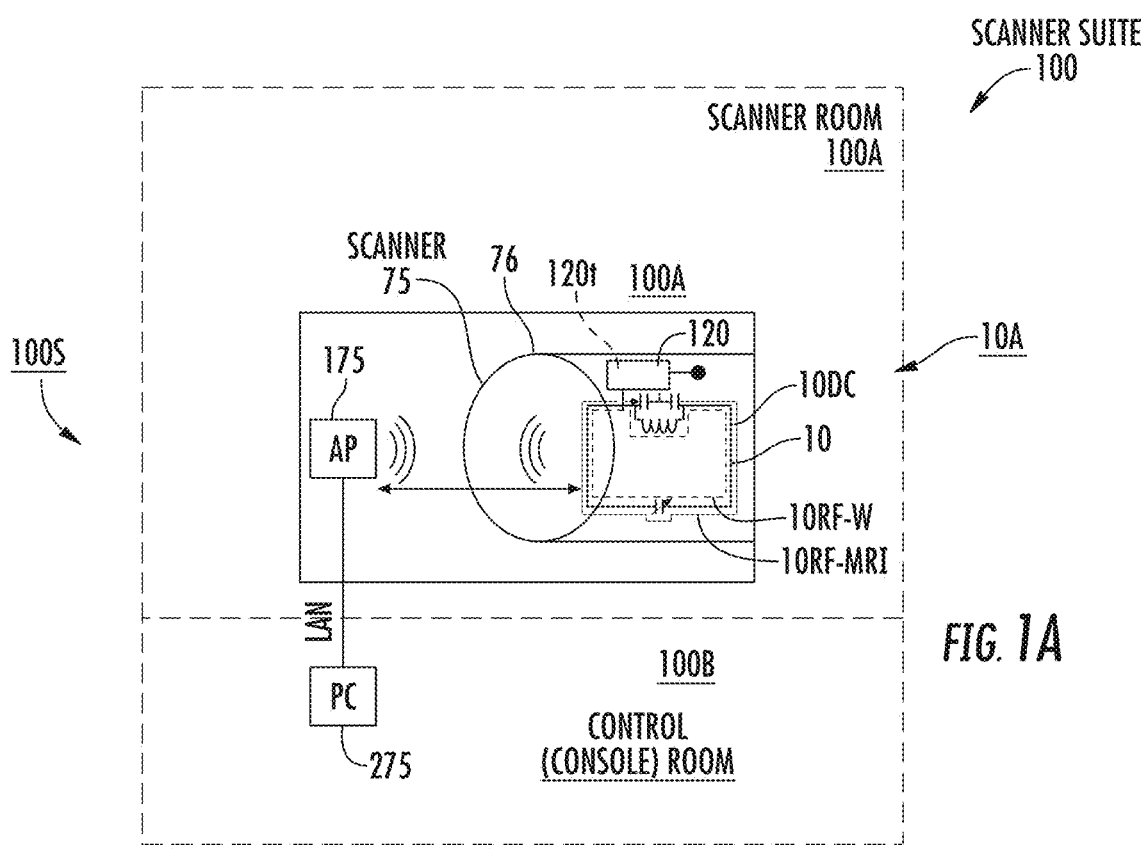
FIG. 1A is a schematic illustration of an MR Suite with an MM Scanner System according to embodiments of the present invention.

The present invention will now be described more fully hereinafter with reference to the accompanying figures, in which embodiments of the invention are shown. This invention may, however, be embodied in many different forms and should not be construed as limited to the embodiments set forth herein. Like numbers refer to like elements throughout. In the figures, certain layers, components or features may be exaggerated for clarity, and broken lines illustrate optional features or operations unless specified otherwise. In addition, the sequence of operations (or steps) is not limited to the order presented in the figures and/or claims unless specifically indicated otherwise. In the drawings, the thickness of lines, layers, features, components and/or regions may be exaggerated for clarity and broken lines illustrate optional features or operations, unless specified otherwise. Features described with respect to one figure or embodiment can be associated with another embodiment of figure although not specifically described or shown as such. The term "FIG." (whether in all capital letters or not) is an abbreviation of the word "Figure" and each can be used interchangeably in the application (in the drawings and in the text of the specification).

The terminology used herein is for the purpose of describing particular embodiments only and is not intended to be limiting of the invention. As used herein, the singular forms "a", "an" and "the" are intended to include the plural forms as well, unless the context clearly indicates otherwise (i.e. at least one) of the grammatical object of the article. By way of example, "an element" means at least one element and can include more than one element.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items.

It will be understood that although the terms "first" and "second" are used herein to describe various actions, steps or components and should not be limited by these terms. These terms are only used to distinguish one action, step or component from another action, step or component. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The term "circuit" refers to an entirely software embodiment or an embodiment combining software and hardware aspects, features and/or components (including, for example, at least one processor and software associated therewith embedded therein and/or executable by, for programmatically directing and/or performing certain described actions or method steps).

The term "wireless module" refers to a device, such as a microchip package, that has a wireless transceiver with a processor and a plurality of general purpose input and output ports. The wireless module can support at least one of: a) standard single input, single output (SISO) wireless data transfer or b) a (high capacity) multiple input, multiple output (MIMO) wireless data transfer, which can overcome the effects of signal multipath or fading within the scanner bore. The term "high capacity" means that the transceiver can transmit data from an RF coil array with signal from multiple RF coil elements also forming wireless communication data RF resonant elements to one or more dipole antennas in a scanner room at sufficient rates to generate MRI images without loss of image resolution relative to conventional systems.

MIMO wireless data transfer employs multiple antennas at the transmitter and also typically at a receiver to significantly increase the data capacity for transferring large amounts of MRI image signal for generating MRI images. High frequency data may be subjected to effects such as signal multipath propagation or multipath fading within the scanner bore. By transmitting independent symbol streams in the same frequency bandwidth, usually termed as spatial multiplexing (SM), a linear increase in data rates is achieved with the increased number of wireless antennas. On the other hand, by using space-time codes at the transmitter, reliability of the detected symbols can be improved by exploiting transmit diversity using signals that originate from two or more independent sources that have been modulated with identical information-bearing signals and that may vary in their transmission characteristics affected by the scanner bore at any given instant in time. Both these schemes assume no channel knowledge at the transmitter. However, the channel knowledge can be made available at the transmitter via feedback from the receiver to the transmitter. A MIMO transmitter may utilize this channel information to improve system performance with the aid of data precoding. Thus, application of these various MIMO techniques may improve data throughput and signal quality of the image transfers. In some embodiments, a single MIMO transceiver can drive the antennas (RF coil elements) used for wireless data transfer thereby cutting integration and power consumption.

High data throughput can be important to transfer large MRI image data sets between the RF coil/RF coil assembly and the scanner console or associated computer or processor in "real time" or "near real time" for diagnostic use. Therefore, by allowing high data throughput, via the MIMO implementation of embodiments of the present invention, during MRI scans the MRI scanner can be used efficiently.

In addition, by using the RF coil assembly with a wireless module electrically connected to one or more of the RF coil elements (which are also MRI RF signal antennas) to wirelessly transfer MRI image data, the scanner size can be reduced and/or certain conventional components may not be required, i.e., removing the need of connective cabling, electronics, and mechanical fixtures, which is desirable in working toward portable MRI scanners.

The wireless data signals in the wireless frequency band can transmit into (and out of) the scanner bore using a MIMO embodiment of the coil elements 10e in the coil array. The coil elements that provide MIMO wireless data transfer can be chosen to maximize the isolation between one another in the wireless frequency band, which will maximize throughput. The coil elements can be positioned orthogonal to one another to spatially maximize isolation between elements and improve multipath reception by increasing the radiation pattern coverage in the frequency band, i.e., the RX and TX for each MIMO pair can be offset, typically substantially orthogonal to one another (meaning orthogonal or within +/−15% from orthogonal).

The wireless module can be a single wireless module or a plurality of wireless modules. The wireless module can be integrated onto a conventional or existing magnetic resonance imaging device, such as a RF preamplifier printed circuit board (PCB), or on a standalone independent PCB or another PCB, which can reside in or on the RF coil assembly or can be attached to the RF coil assembly. The wireless module can be provided as an internal or integrated module of a multipurpose module with operational circuitry such as a battery pack module (which may interchangeably be referred to herein as a "battery module").

The term "programmatically" means that the operation or step can be directed and/or carried out by a digital signal processor and/or computer program code. Similarly, the term "electronically" means that the step or operation can be carried out in an automated manner using electronic components rather than manually or rather than using mental steps. The term "electronically" with respect to connections includes both wireless and wired connections between components.

The term "automatically" and derivatives thereof means that the operation and/or method can be substantially, and typically entirely, carried out without manual input, and is typically programmatically directed and/or carried out.

The terms "MRI scanner" and "MR scanner" are used interchangeably to refer to a Magnetic Resonance Imaging system. The MR scanner includes a permanent or superconducting (high-field) magnet and the operating components, e.g., the RF amplifier, gradient amplifiers and one or more processors that typically direct the pulse sequences and select the scan planes. Examples of current commercial scanners include: GE Healthcare: Signa 1.5 T/3.0 T; Philips Medical Systems: Achieva 1.5 T/3.0 T; Integra 1.5 T; Siemens: MAGNETOM Avanto; MAGNETOM Espree; MAGNETOM Symphony; MAGNETOM Trio; and MAGNETOM Verio. As is well known, the MR scanner can include a main operating/control system that is housed in one or more cabinets or consoles that reside in an MR control room while the MRI magnet resides in the MR scan room. The control room and scan room can be referred to as an MR suite and the two rooms can be separated by an RF shield wall. The term "high-magnetic field" refers to field strengths above about 0.5 T, typically above 1.0 T, and more typically between about 1.5 T and 10 T. Embodiments of the invention may be particularly suitable for 1.5 T, 2.0 T and 3.0 T systems, or higher field systems such as future contemplated systems at 4.0 T, 5.0 T, 6.0 T, 7.0 T, 9 T and the like. The MR Scanners can be open bore or closed bore systems. The wireless (data transfer) module and/or RF coil assembly with the wireless module can also be suitable for portable MR Scanners, including those that are relatively light weight and/or comprise permanent and/or lower field magnets for creating the magnetic field of the scanner. See, e.g., U.S. 2014/0111202 and US 2015/0177343, the contents of which are hereby incorporated by reference as if recited in full herein.

The devices, methods and systems can be used for any target objects including animals and humans or other target material including, for example, inanimate material such as petroleum rock core samples.

The term "patient" refers to humans and animals.

The term "clinician" means physician, neurologist, radiologist, physicist, or other medical personnel desiring to review medical data of a patient. The term "workstation" refers to a display and/or computer associated with a clinician.

The term "about" refers to a parameter that can vary from the recited value, typically between +/−20%.

Each article, reference and patent cited or discussed herein is hereby incorporated by reference as if recited in full herein.

The terms "simultaneously" and "concurrently" are used interchangeably and mean that the noted components are operative for a time period that overlaps or that is coextensive, e.g., substantially concurrently or at the same time.

Existing MRI technologies can use one coil, or separate coils, for transmit and receive purposes to generate and acquire MR signals. Recent parallel imaging technologies in MRI typically require one coil for transmit, and a separate coil array for parallel receive. The term "parallel transmit" means RF $B_1$ shimming is being performed (not typically used on 3 T, mostly currently used on 7 T). The term "parallel imaging" refers to only parallel receive.

The term "RF coil" refers to a volume coil or coil array configured to transmit an RF excitation pulse or pulse sequence and/or receive MR (RF) signal in response to the excitation pulse for generating NMR spectra or imaging data. The term "RF coil array" refers to an RF coil with a plurality of coil elements, which can include transverse electromagnetic (TEM) coil elements.

The RF coil array typically has between 2-512 coil elements sized for a particular target anatomy, including, for example, 4-128 coil elements for a head coil. However, the RF coil array can be generally applicable to a variety of coil geometries designed for different applications, such as cardiac, brain, musculoskeletal or any other parts of human, in vivo or material imaging using any coil shape and any number of coil elements.

The term "RF signal" refers to RF current, RF voltage or RF potential. The term 'transmit' means RF transmit/transmission or excitation/excite, i.e., transmit the RF field from an RF coil for exciting MR spins in target material such as tissue.

The term "receive" means RF receive/reception, i.e., the RF coil receives the RF signal due to RF field flux change resulted from spin coherence in the target material, e.g., tissue.

The term "antenna" when referring to the RF coil elements of the RF coil assembly for wireless communication in a wireless frequency band, refers to any "resonant element" in the wireless frequency band.

In order to acquire MRI image with uniform spatial coverage and without spatial distortion, a homogeneous main static magnetic field ("$B_0$") is required. Conventionally, a homogeneous magnetic field is obtained through whole-body shimming coils to compensate the linear and high-order field inhomogeneities. These whole-body coils, the so-called spherical harmonics (SH) shim coils, often cannot effectively correct local or high-order field inhomogeneities. More recently, the advent of local shimming technologies, using a set of direct current (DC) loops closely placed to the imaging sample, showed promise in achieving a more uniform magnetic field $B_0$. However, this technology requires a third set of coils, which takes up additional space and also pushes the imaging coils (the RF transmit and receive coils) further away from the sample, which can result in significantly reduced RF SNR and increased RF power consumption.

Generally stated, some embodiments of the invention are directed to a new concept that integrates transmit and/or receive and $B_0$ shimming using the same set of RF coil elements (either RF coil elements or TEM coil elements), which can simultaneously accommodate (i) RF, e.g., alternating current (AC) at radiofrequency (RF) transmit and/or receive (ii) direct current (DC) to generate local $B_0$ fields for $B_0$ shimming and (iii) at least some of the coil elements can also provide wireless communication data transmission in a wireless frequency band. Other embodiments do not require that the RF coil elements perform the DC $B_0$ shimming.

Currently known wireless systems by others use very high frequencies which imposes operational constraints and/or issues. In contrast, embodiments of the present invention do not require additional antennas on the RF coil. Instead of adding a separate array of dipoles, tuning components, back end electronics etc., embodiments of the present invention can use existing hardware of the RF coil, i.e., the RF coil elements 10e are also the wireless communication data resonant elements (i.e., antennas) that can also resonate in the wireless communication frequency band. This reduces cost and complexity and does not require antenna isolation but rather just attention to the impedance transformation between the RF coil and the transmission lines. In general, the use of additional antennas inside the bore are not desired because they take space, add cost, and are technically much more complicated.

Embodiments of the invention are directed to a modification of RF coils having integrated parallel reception, excitation, and shimming (iPRES). See, e.g., co-pending U.S. patent application Ser. No. 13/898,993; PCT Patent Application PCT/US2013/042020, and U.S. Patent Application Publication No. 2016/0116556, the contents of which are hereby incorporated by reference as if recited in full herein. See also, Truong T K, Darnell D, Song A W (2014). Integrated RF/shim coil array for parallel reception and localized $B_0$ shimming in the human brain. NeuroImage 103: 235-240, the content of which is also hereby incorporated by reference as if recited in full herein. This technique uses a new RF coil assembly 10A that allows an RF current and a direct current (DC) to flow in the same coil element 10e simultaneously while also allowing concurrent wireless data transmission using at least some of the coil elements of the RF coil, thereby allowing parallel RF excitation/reception, localized $B_0$ shimming and wireless data communication with a single coil array using only the RF coil elements 10e of the RF coil as the wireless data transmission antennas without requiring an additional antennas or any additional array of dipole antennas attached to the RF coil assembly 10A.

Referring to FIGS. 1A, 1B, 1C and 2, an RF coil assembly 10A includes a wireless module 120 with a wireless transceiver 120t that is electrically connected to an RF coil assembly 10A to allow RF currents at the Larmor frequency (10RF-MRI) and wireless data transmission frequency (10RF-W) to flow on the same RF conductor 10c of at least one coil element 10e simultaneously without impacting image quality.

Figure 3A:
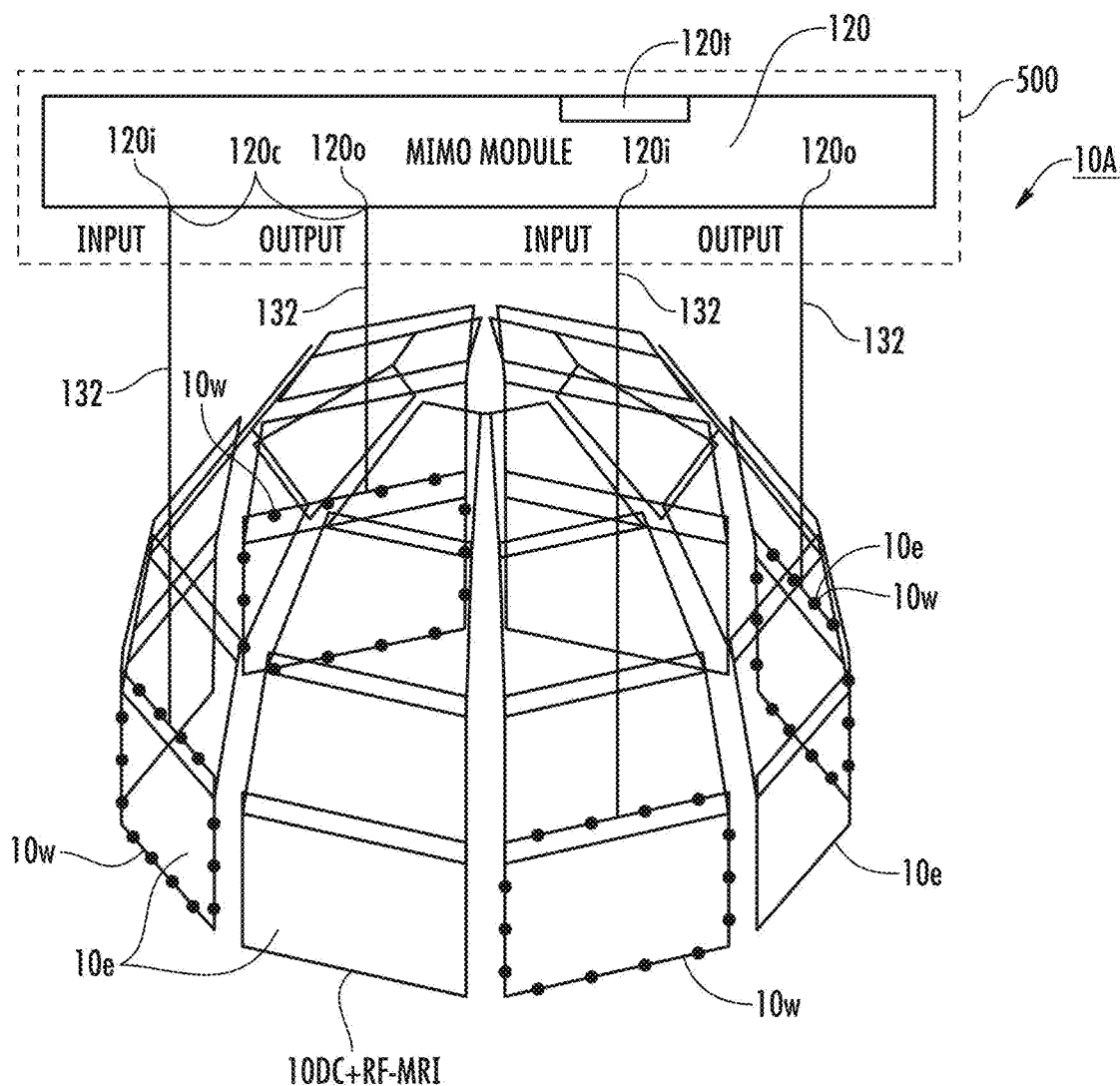
FIG. 3A is a schematic illustration of an RF coil assembly with a plurality of RF coil elements and a wireless module where multiple coil elements are receive input channels and multiple coil elements are transmit output channels to the wireless module according to embodiments of the present invention.

Some or all of the coil elements 10e can be tuned to support wireless data transmission in the wireless frequency band and MRI RF signal transmission. Some or all of the coil elements 10e can be electrically connected to a single wireless transceiver 120t via one or more respective transmission lines or paths 132 and/or DC connections 138. In some particular embodiments, as will be discussed further below, only a subset of the RF coil elements 10e of the RF coil assembly 10A are electrically attached to an antenna input or connection 120a at the transceiver 120t via respective transmission lines or paths 132 (FIG. 3C). One, some or all the coil elements 10e can be modified/configured for resonating in the wireless frequency band. Those elements 10e can couple to one or multiple antenna input/connection 120a on a single wireless module or can couple to antenna inputs on different wireless modules.

Some or all of the coil elements 10e can include first and second RF-isolated segments or ports 111, 112, at a perimeter of the conductive trace or conductor 10c forming the RF coil element 10e. Where used, the first RF port or segment 111 can be for the Larmor frequency RF signals and can be electrically connected to a first bandstop filter 121. The second RF port or connection 112 can be for the wireless data transmission at the wireless data frequency band and can have a second bandstop filter 122. The first bandstop filter 121 can have high impedance at the operational frequency of the second port 112 and/or filter 122. Likewise, the second bandstop filter 122 can have high impedance at the operational frequency of the first port 111 and/or filter 121 to provide electrical isolation between the ports or segments 111, 112.

As used herein, the term "bandstop filter" is not limited to any particular filter configuration and is used in a broad manner to refer to any device, configuration or feature (digital or analog or analog and digital) that provides a high impedance electrical isolation between the two ports or segments 111, 112 at a phase plane of the filter(s) 121, 122 and/or coil element 10e adjacent thereto. The bandstop filter may comprise a series tank filter.

The term "high impedance" with respect to the bandstop filters 121, 122 means that the minimum magnitude of the impedance at the output of the first filter is sufficient to provide an open circuit at the phase plane of the coil element 10e, in the operational frequency of the other port (and/or filter) and is typically about 1000 Ohms or more, with a reactance greater than 500 Ohms, thereby providing an open circuit at the phase plane of the corresponding coil element 10e.

The filters 121, 122 can be configured so that the frequencies within the operational stop-band bandwidth are not terminated into a load of the wireless module 120 but experience a high impedance reflection at a phase plane of the filter placed adjacent to the corresponding antenna or coil element 10e, keeping respective and different frequency RF currents on the resonant structure of the respective RF coil elements 10e.

The bandstop filters 121, 122 can be configured as multiple stages of series resonators that are tuned to reject RF currents at the operational frequency band of the adjacent RF port, which provides suitable isolation for simultaneous MR image acquisition and wireless data communication at the wireless frequency band. As noted above, the filters 121, 122 can be digital filters or analog filters or combinations of digital and analog. In some embodiments, the bandstop filters 121, 122, coupled to the coil elements 10e may perform analog processing or digital signal processing to filter input signals and/or output signals. The filter coefficients of the bandstop filters may be adjusted using digital signal processing to mitigate the interference effects of the RF excitation signals or the MRI image signals with the wireless communication data signals at the wireless communication frequency band.

The transceiver 120t of the at least one wireless module 120 may be one or more of electrically, magnetically and/or physically coupled to one, some or all of the coil elements 10e of the RF coil array 10A.

Where two spaced apart bandstop filters are used, one or both of the filters 121, 122 can be adjacent to, or incorporated into, the perimeter (phase plane) of a respective coil element 10e. As will be known to one of skill in the art, the term "phase plane" is associated with a position on the RF coil element 10e where the physical RF reflections are parameterized via the impedance at the frequency band of interest.

The Smith chart may be utilized to select specific coil elements 10e in the RF coil array as the MIMO resonant elements to reduce interference between individual MIMO resonant elements. The Smith chart may be used to optimize parameters such as impedances, admittances, reflection coefficients, etc. such that the resonant elements have varying phases that provide reduced interference with one another and/or with Larmor frequencies.

In some particular embodiments, for high-magnetic field MRI systems, without limitation and by way of example only, placement of the bandstop filter 122 can be within about 5 mm of the perimeter of the RF conductor 10c of a respective coil element 10e between the RF conductor 10c and the transmission line 132 to the wireless transceiver 120t, more typically within about 1 mm. The position of one or both of the filters 121, 122 relative to the phase plane of the coil element can influence RF performance as the filter location relative to the coil element structure 10e can define an impedance transformation, and a physical reflection, on the antenna element 10e to maximize antenna performance metrics (efficiency, gain, etc.) for different RF frequencies supported by the antenna element 10e.

The bandstop filter 122 for the Rx/Tx connection or port 112 can be configured such that a 50 Ohm or other desired operational impedance is presented at a respective coil element 10e for the operational frequencies of its operational band to maximize power transfer, while presenting a high-impedance open circuit at the MRI Larmor frequency band to prevent MRI signal loss. Similarly, the bandstop filter 121 placed between the coil element 10e and the MRI feed port or connection 111 can present a suitable impedance at the Larmor frequency that is matched to the MRI preamplifier ("pre-amp") and a high impedance at the wireless communication frequencies/frequency band. The pre-amp 161 (FIG. 4B, 4C) can have a 50 Ohm impedance or other impedance above 50 Ohm as will be known by one of skill in the art.

Figure 1B:
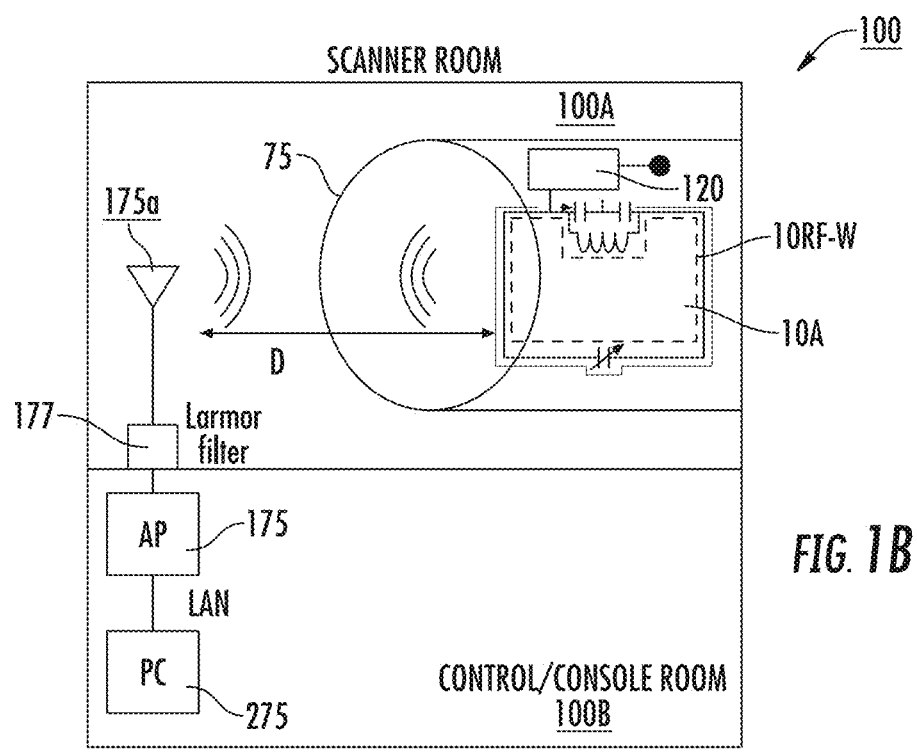
FIG. 1B and FIG. 1C are schematic illustrations of other embodiments of an MR Suite with an MRI Scanner System according to embodiments of the present invention.
Figure 1C:
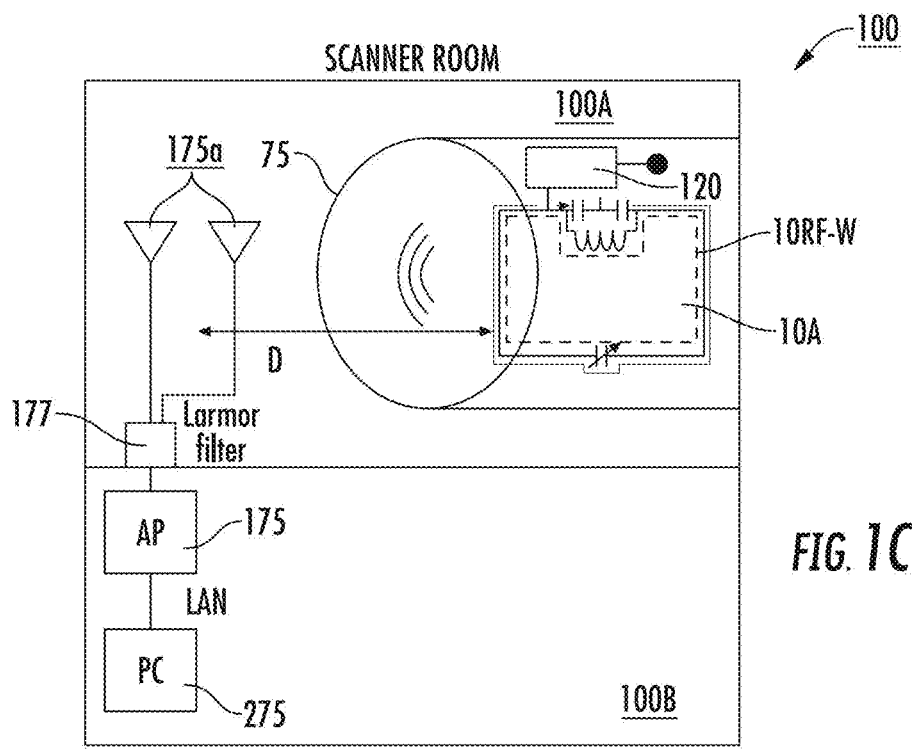
Figure 6A:
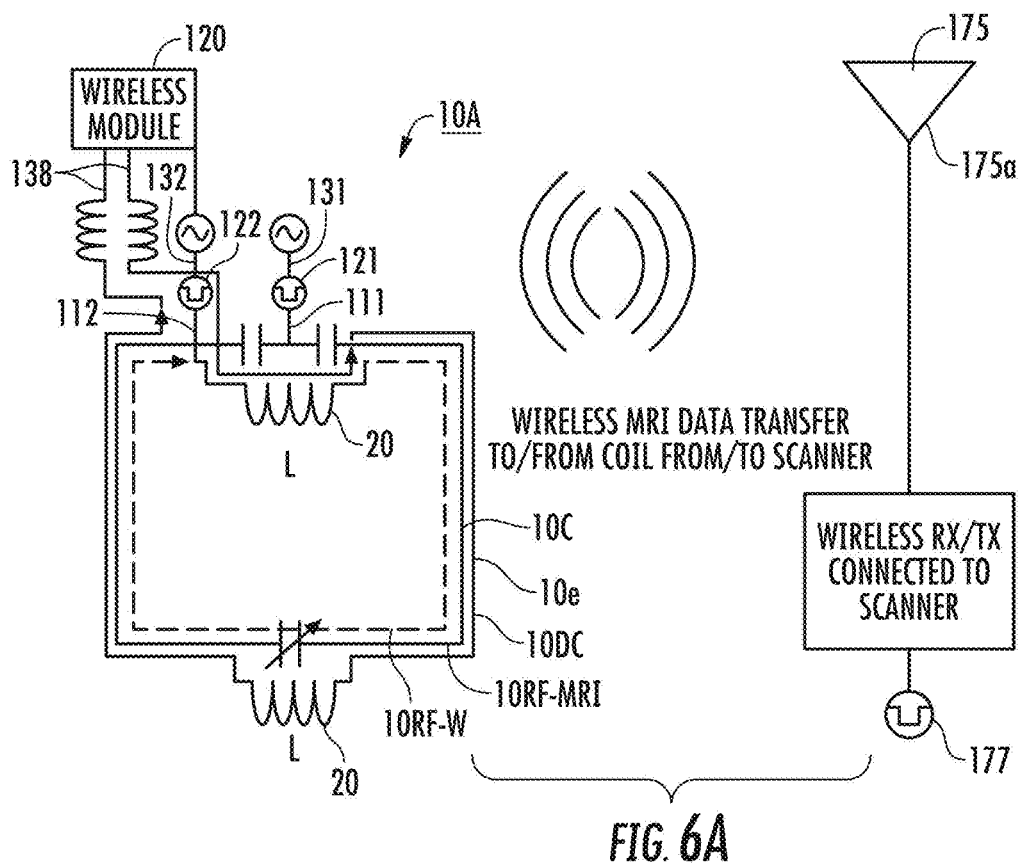
FIG. 6A is a schematic illustration of an RF coil assembly with a wireless module electrically attached to at least one RF coil element thereof and that can directly wirelessly transmit and receive data to and from an in-room antenna according to embodiments of the present invention.

FIG. 1A shows the MR Scanner System 100S with a RF coil assembly 10A in a bore of a magnet 76 of a scanner 75 in a scanner room 100A of a MRI suite 100. The scanner room 100A is typically RF shielded as is well known. The scanner room 100A can have an Access Point (AP) 175 with a dipole antenna 175a that can wirelessly transmit and receive data to/from the RF coil assembly 10A directly without requiring an antenna array attached to the RF coil assembly 10A. The AP 175 can connect to a control console, workstation and/or computer 275 in the control room 100B of the MRI suite 100, typically via a LAN (Local Access Network). The AP 175 can be attached to a wall (or ceiling or floor) of the scanner room 100A a distance D of between about 3-16 feet, typically about 5 feet from the RF coil assembly 10A. The communication dipole 175a of the AP 175 can be mounted to an interior wall passed through a MRI bandstop filter 177 which can isolate the AP 175 from the scanner 75 (FIG. 6A). In this way, communication data can be wirelessly directly transmitted from the wireless module 120 (wireless transceiver 120t) of the coil assembly 10A to the AP 175 via the MRI isolated dipole antenna 175a. FIG. 1B illustrates that the AP 175 can be on the outside (in the control room 100B, for example) with only a dipole antenna 175a, or a plurality of dipoles 175a (MIMO) as shown in FIG. 1C for higher throughput, in the scanner room 100A. The dipole 175a can be mounted to the wall of the scanner room or the scanner housing itself and feed the signal via a coaxial transmission line through a bandstop filter 177 at the Larmor frequency to the AP 175 outside the scanner room 100A.

MR image data is generated by measuring an MRI-induced RF current with each RF coil element 10e of an array 10A, which are all tuned to receive data at the MRI Larmor frequency. The induced RF current in each element can flow from the coil feed port 111 via a transmission line 131 to a preamplifier 161 (FIG. 3C, 4C). The transmission line 131 accepts frequencies at, and near, the Larmor frequency, but terminates or rejects frequencies outside this range into a mismatched load. The data received by each pre-amp is then combined and post-processed to create an image on the MRI scanner console or computer 275 (FIG. 1A). To perform simultaneous MRI image acquisition and wireless communication with the same coil element 10e at the same time without adversely impacting MRI signal quality or the wireless data transmission, the wireless transceiver 120t of the wireless module is connected via a transmission line 132 to the coil element 10e. However, the wireless Rx/Tx module, like the MRI pre-amp, will only accept RF currents at the frequencies within its operational frequency band and otherwise terminates, or rejects, the currents outside this band into a mismatched load. To inhibit or prevent signal loss caused by a direct connection to the coil element 10e and the transceiver 120t and the pre-amp 161, bandstop filters 121, 122 can be used as discussed above.

Figure 2:
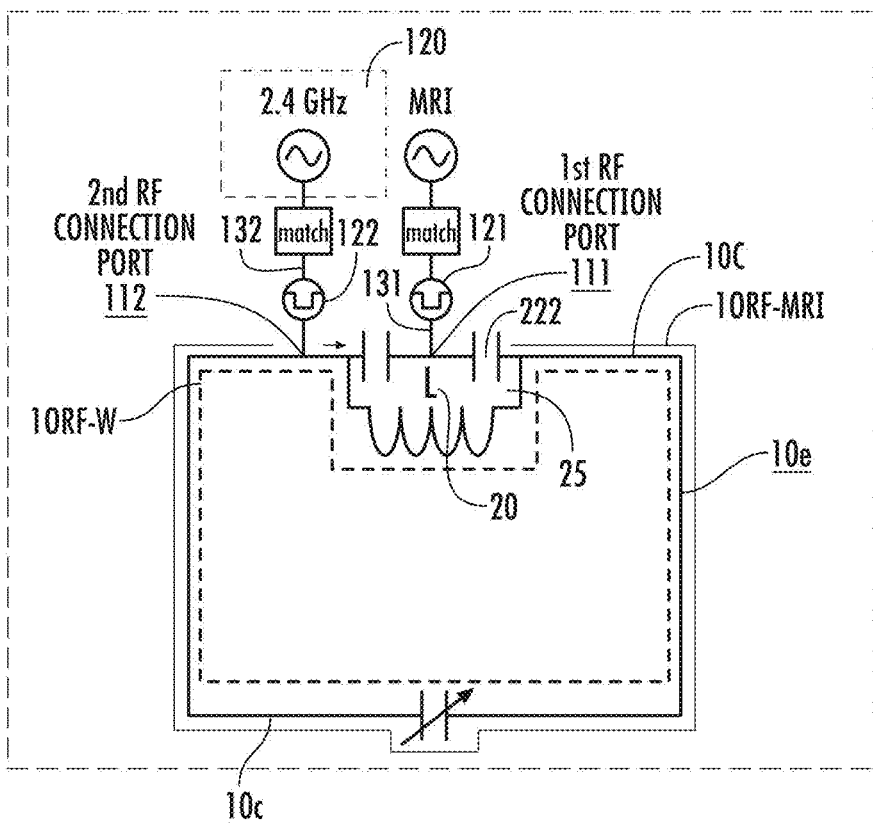
FIG. 2 is a schematic illustration of an RF coil assembly according to embodiments of the present invention.

As shown in FIG. 2, an inductor 20 (also labeled "L") of an LC circuit segment 25 can provide an alternate current path at the RF transmission line 111 allowing DC current and RF wireless data to travel across the inductor 20 while the RF current of the Larmor frequency travels across the RF conductor 10c (and at least one capacitor 222 of the LC circuit segment 25) to the RF transmission line 131 at the first RF connection port 111.

The wireless receiver module 120 can have a transceiver 120t that operates on a standardized frequency band for wireless communication data transfer. The frequency bands can vary by country or region. Embodiments of the invention can employ a WiFi frequency band or other suitable frequency band (licensed or unlicensed) and the frequency band may vary by region or country. Embodiments of the invention may employ an LTE (Long Term Evolution) frequency band. Tables 1 and 2 of exemplary frequency bands are shown below.

Referring to FIG. 2, in some particular embodiments, the wireless module 120 can be a WiFi wireless module. The RF coil assembly 10A can be configured to operate with a 3 T MRI scanner system. The RF coil assembly 10A can perform simultaneous MRI image acquisition (optionally at 3 T) and wireless data transmission at about 2.4 GHz (WiFi). The RF coil assembly 10A can include a high-impedance 2.4 GHz band-stop filter 111 between the coil 10 and the MRI transmission line 131 to prevent 2.4 GHz signal loss to the MRI port 111. Likewise, a 127.7 MHz (for 3 T) band-stop filter 121 can be placed between the RF coil 10 and the WiFi transmission line 132 to maintain the MRI signal-to-noise ratio (SNR). A readily available 802.11b/g WiFi transceiver 120t with on-board general purpose input output (GPIO) connections 120c (FIG. 3A, 3C) can be used to perform wireless data transmission between the coil element 10e and a dipole 175a and/or a 2.4 GHz access point (AP) 175 placed inside or outside the scanner room 100A and provide "on-board" active control of peripheral (accessory) systems or devices in the scanner 75 (FIG. 1A, 1B).

In some embodiments, unlicensed bands (e.g. 2.4 GHz and 5.1 GHz) for LTE or LTE-like transmission may be used while co-existing with other wireless standards, such as WLAN IEEE 802.11 and Bluetooth. In particular, in the 5 GHz unlicensed band there are many channels available that can be used for transmission of the MRI image data. Table 2 illustrates unlicensed bands that may be suitable for the wireless data transmission described herein. These bands may be selected based on the maximum power at which data may be transmitted in these unlicensed frequency bands for proper reception by the receiver at the MRI console or auxiliary computers in view of transmission interference by the MRI scanner.

TABLE 1

ISM bands defined by the ITU Radio Regulation

| Frequency low | Frequency high | Unit | Bandwidth | Application |
| --- | --- | --- | --- | --- |
| 6765 | 6795 | KHz | 30 | |
| 40.66 | 40.7 | MHz | 0.04 | |
| 433.05 | 434.79 | MHz | 1.74 | |
| 698 | 2620 | MHz | 100 | LTE |
| 902 | 928 | MHz | 26 | UNB/Sigfox<br>LoRa<br>Z-Wave/Sigma Designs<br>Weightless-N/Nwave |

TABLE 1-continued

ISM bands defined by the ITU Radio Regulation

| Frequency low | Frequency high | Unit | Bandwidth | Application |
|---|---|---|---|---|
| 2300 | 2400 | MHz | 100 | TDD LTE band 40 (TD 2300) |
| 2400 | 2500 | MHz | 100 | Bluetooth 802.15.1 WiFi 802.11b/g ZigBee 802.15.4 |
| 2570 | 2620 | MHz | 50 | TDD LTE band 38 (TD 2600) |
| 5725 | 5875 | MHz | 150 | WiFi 802.11a/n/ac LAA |
| 24 | 24.25 | GHz | 0.25 | |

ISM: Industrial, Scientific and Medical radio bands
ITU: International Telecommunication Union's (ITU)
Region 1: EMEA, Persian Gulf, Russia and Mongolia
Region 2: America, Greenland and eastern Pacific Islands
Region 3: Asia, Oceania

TABLE 2

U-NII bands defined by the FCC regulation

| Name | Frequency low | Frequency high | Unit | Bandwidth | Max power | Application |
|---|---|---|---|---|---|---|
| U-NII-1 | 5150 | 5250 | MHz | 100 | 50 mW | WiFi 802.11a/n/ac LTE-U |
| U-NII-2 | 5250 | 5350 | MHz | 100 | 250 mW | |
| U-NII-2e | 5470 | 5725 | MHz | 255 | | |
| U-NII-3 | 5725 | 5825 | MHz | 100 | 1 W | WiFi 802.11a/n/ac LTE-U |

FCC; Federal Communications Commission
U-NII; Unlicensed National Information Infrastructure LTE Deployment in Unlicensed Spectrum
LTE-U; LTE Unlicensed using CSAT (Carrier Sensing Adaptive Transmission) access LWA; LTE-WiFi Link Aggregation
MulteFire: LTE-based technology for small cells operating solely in unlicensed spectrum
SDL Supplemental Downlink
CSAT Carrier Sensing Adaptive Transmission
LBT Listen Before Talk Referring to FIG. 3A, the RF coil assembly 10A, shown with an optional head coil configuration, can include a plurality of wireless data input and output paths/connection lines 132, one or more between some or all of the different coil elements 10e, and input and output ports 120i, 120o, respectively, of the wireless module 120. In this example embodiment, the wireless module 120 has a 2×2 MIMO configuration in which one module 120 can be connected to four different coil elements 10e to perform wireless communication data transfer. However, other MIMO configurations may be used and other MIMO connections to one or more of the coil elements 10e of a respective RF coil array 10A can be used.

The RF coil array 10A can increase the wireless data throughput between the coil array 10 and the scanner 75 (or scanner console 275) by using multiple coil elements 10e as receive input channels and multiple coil elements 10e as transmit output channels (MIMO) to the wireless module 120. The coil elements 10e used for wireless, data transmission 10w can be electrically isolated and spatially separated from one another as shown in FIG. 3A. The coil elements 10e selected for wireless data transmission 10w can be spatially optimized input and output coils (dotted perimeter lines) to provide electrical isolation between respective coils and/or increase wireless data throughput to/from the array while minimizing the RF coupling between the MIMO elements 120i, 120o at the frequencies of interest. The remaining coil elements 10e (light and dark gray) of the array 10A can be used only for MRI signal reception 10RF-MRI and local B0 shimming 10DC. Embodiments of the invention do not require that the RF coil elements 10e be used for local B0 shimming. The remaining coil elements 10e can be for only MRI RF excitation, for only MRI RF signal reception or for only MRI RF excitation and MRI signal reception.

Thus, in some embodiments, only some of the coil elements 10e of the RF coil assembly 10A transmit or receive wireless communication signal 10w as needed for particular applications. The coil elements 10e that receive or transmit wireless communication signal 10w can be physically spaced apart from each other, separated by at least one neighboring coil element 10e that is not used for wireless communication data signal transmission 10w.

Figure 3B:
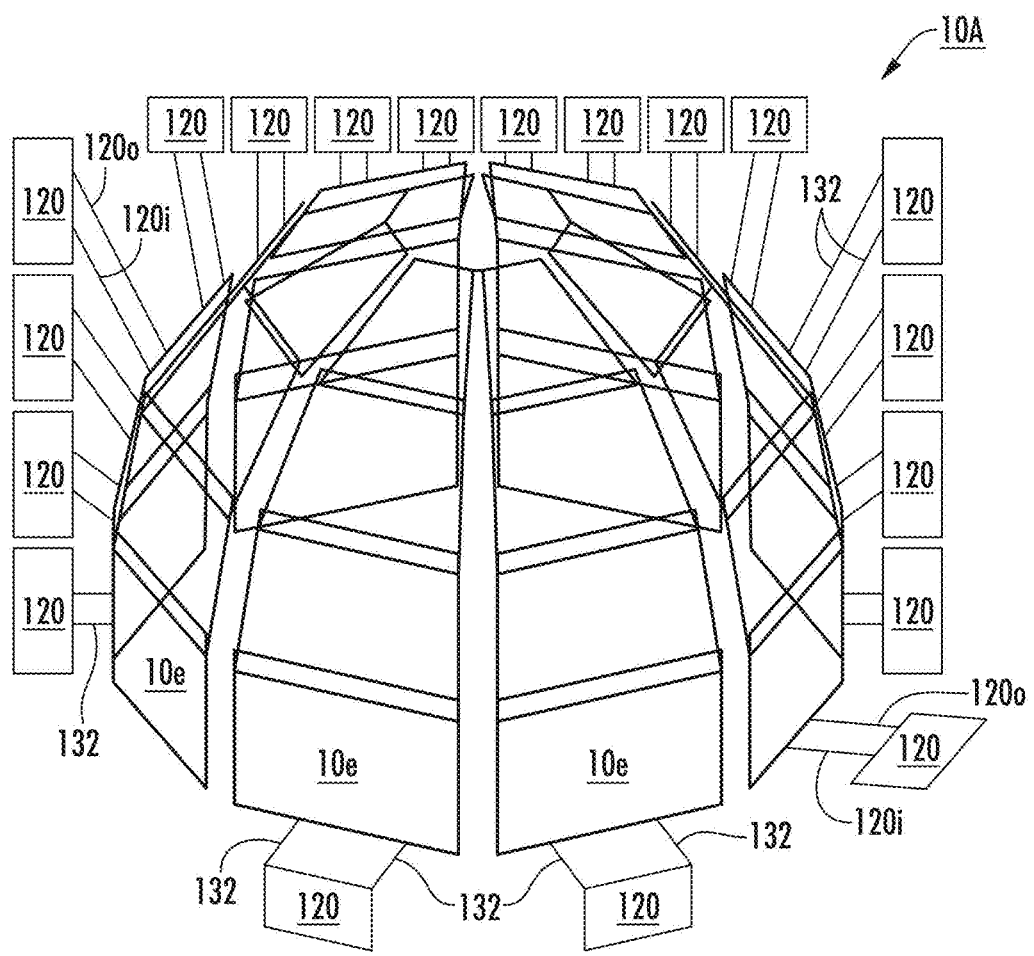
FIG. 3B is a schematic illustration of another RF coil assembly with a plurality of RF coil elements and a plurality of wireless modules where coil elements are receive input channels and transmit output channels to a respective single wireless module or shared wireless modules according to embodiments of the present invention.
Figure 3C:
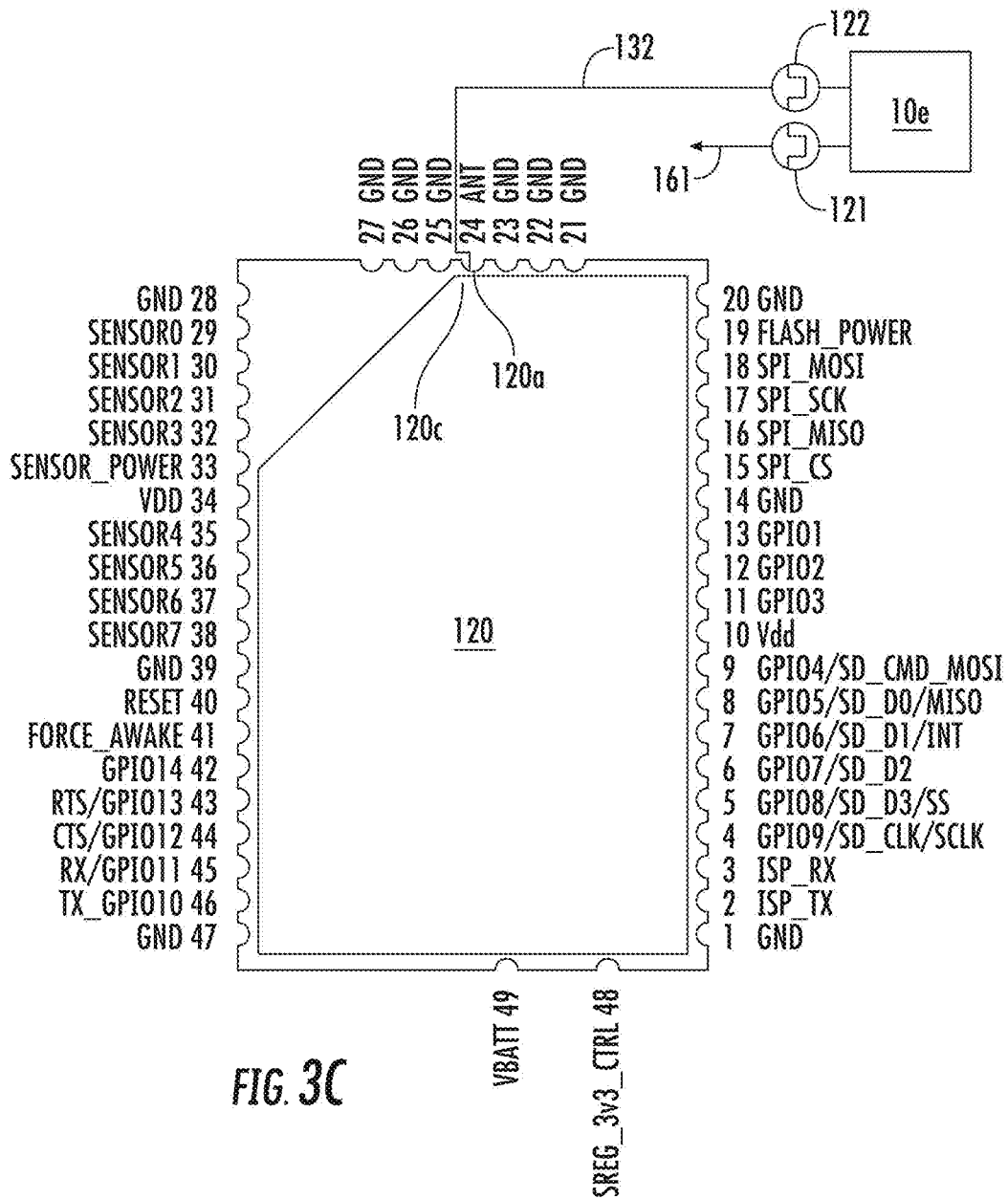
FIG. 3C and FIG. 3D are schematic illustrations of an example wireless module connected to an RF coil assembly according to embodiments of the present invention.

FIG. 3B illustrates that more than one wireless module 120 can be used for a respective RF coil assembly 10A. That is a plurality of wireless modules 120 can be used for a respective RF coil assembly 10A. One or more of the wireless modules 120 can be connected to a corresponding single coil element 10e and may be connected to both input and output channels 120i, 120o, respectively, via connection lines 132 and/or 138. Some or all coil elements 10e can be connected to a corresponding different wireless module 120. This can allow multiple independent data streams from the RF coil assembly 10A.

Figure 3D:
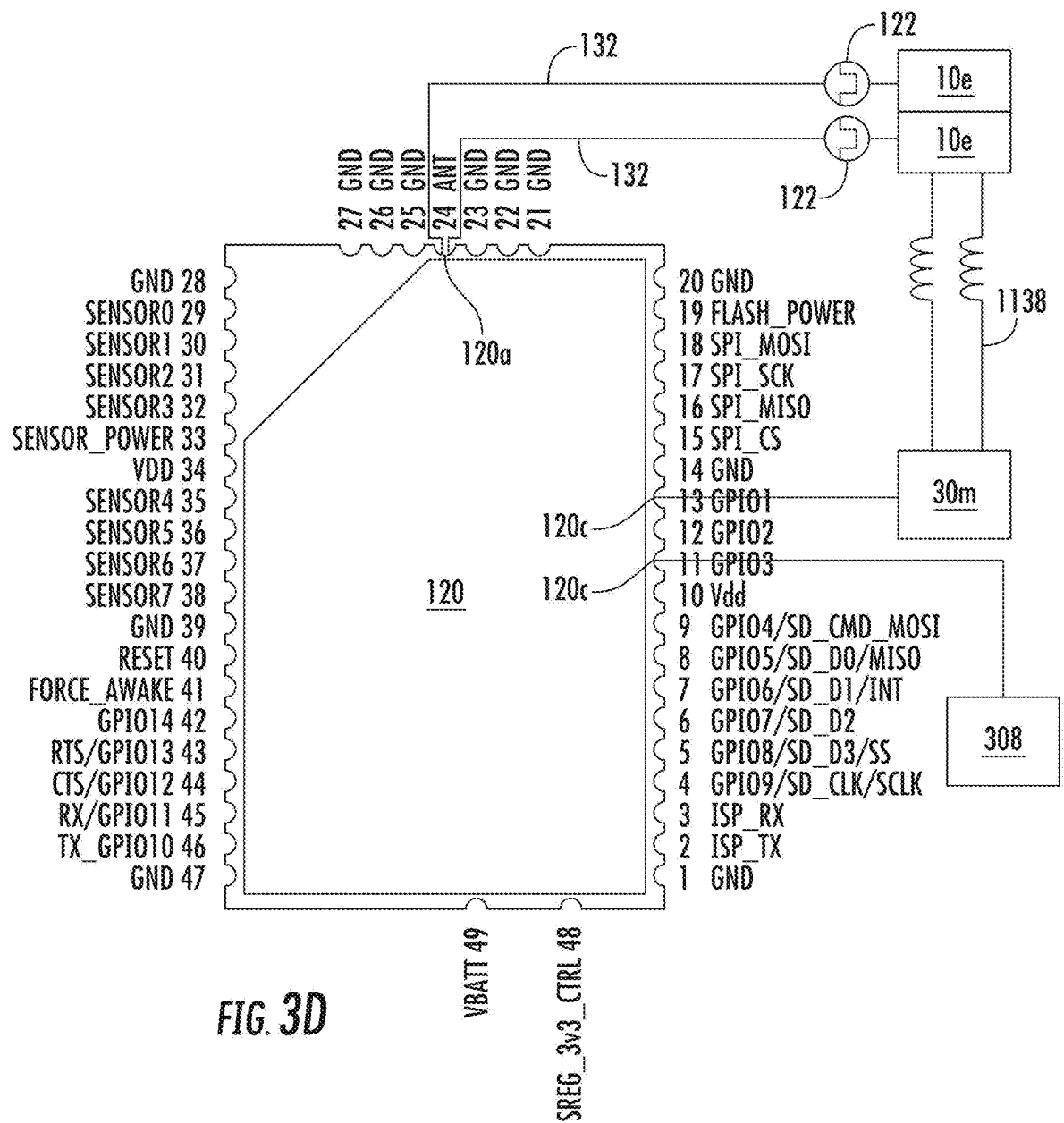

FIG. 3C and FIG. 3D are examples of a wireless module 120 connected to one or more RF coil elements 10e. To be clear, the invention is not limited to this example wireless module and other wireless modules and/or wireless module configurations may be used. The RF coil elements 10 are connected to the RF antenna connection 120a (in this single input/output diagram, pin 24) with transmission lines 132 and with bandstop filters 121, 122 positioned adjacent the respective RF coil element 10e.

In some embodiments, a two port module or a multiplexer (a multiplexing device or a device that sends multiple signals on a carrier channel at the same time in the form of a single, complex signal to another device that recovers the separate signals at the receiving end) can be used to combine the MRI RF image signal data together (i.e., another IC (Integrated Circuit) can be used with the wireless module 120 as will be understood by one of skill in the art). As discussed above, the bandstop filters 121, 122 can be placed adjacent or on a perimeter (phase plane) of the coil element 10e. It is noted that use of bandstop filters as shown and described (particularly in a non 50 Ohm environment) is novel and allows the concurrent wireless MRI RF signal and communication data signals on respective coil elements 10e.

Figure 5B:
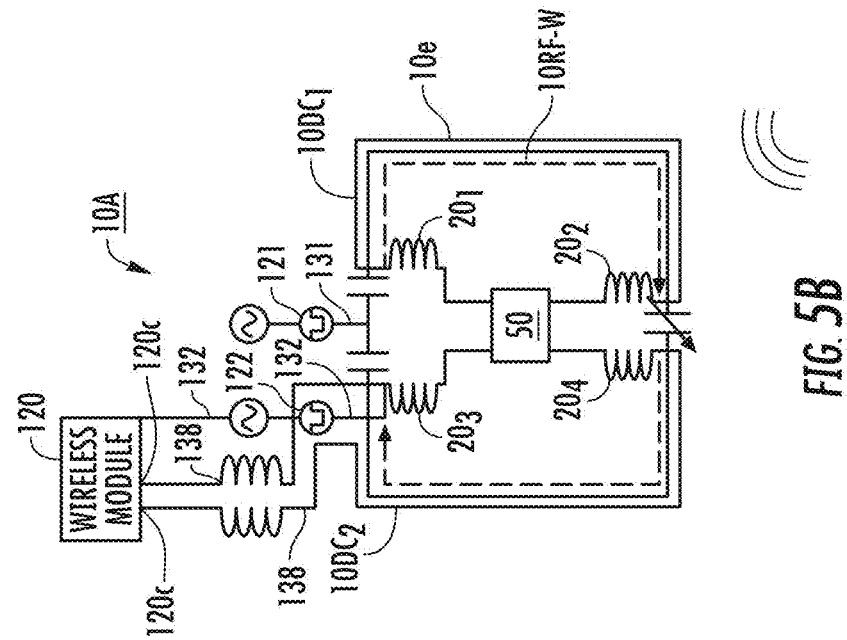
FIG. 5B is a schematic illustration of an RF coil assembly with a wireless module and different transmission paths between the wireless module for data transfer and a DC shimming current, respectively, according to embodiments of the present invention.
Figure 5A:
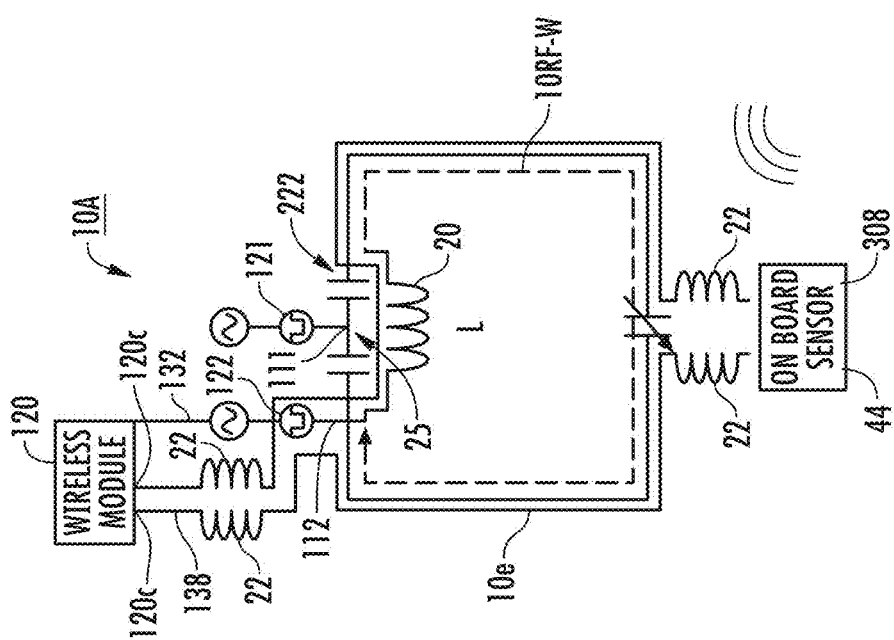
FIG. 5A is a schematic illustration of an RF coil assembly with a wireless module and different transmission paths between the wireless module for data transfer and a DC control voltage, respectively, according to embodiments of the present invention.

FIG. 3D illustrates that GPIO connections 120c can be connected to the coil elements 10e to perform B0 shimming, or to provide controls of peripheral devices 308 such as sensors, switches, etc . . . , in the coil assembly 10A (see, FIG. 4C, 5A, 5B). The term "peripheral devices" refers to supplemental devices not required for MRI imaging, but to allow or facilitate patient related processes during the MRI exam if required. Examples of peripheral devices include, but are not limited to, sensors, cameras, alarms, monitors, and switches. In some embodiments, both the RF MRI signal and RF wireless data signal currents and GPIO DC currents can be driven on the same conductors about the coil elements 10e.

In some embodiments, the wireless module 120 is or comprises at least one SISO wireless module.

A GPIO connection 120c can be coupled to a DC source 30, such as a battery pack module 30m, and a DC connection 1138 can couple the battery pack module 30m to the coil element 10e via Lchoke 22. One or more than one coil element 10e can be connected to GPIO connections 120c of the wireless module 120 and/or a DC power source 30 via first and second connections 1138 (and inductor chokes) to form a DC loop 10DC.

The coil element 10e can be attached to the RF input 120a (ant pin 24) for communication data transfer, after which the GPIO connections 120c (pins) can be activated. For example, from the scanner 75, wireless data can be transmitted to the RF coil assembly 10A, which can then be processed at antenna connection 120a (pin 24) and the module 120 can activate a set of GPIO connections 120c. The GPIO connections 120c can directly or indirectly provide current for shimming respective coil elements 10e, turn on peripheral devices 308 and the like. In some particular embodiments, the GPIOs 120c can be used to turn on different DC sources in a rechargeable MR compatible battery pack or module 30m providing a DC power supply 30 (FIG. 3D, 9, 12, 13). The batteries 30b are non-ferromagnetic and can be a non-ferromagnetic lithium polymer battery. An example of a suitable battery GM-NM103450-PCB, 1800 mAhr, 3.7V, from Power Stream Technology, Orem, Utah.

FIG. 4A illustrates an integrated parallel reception, excitation, and B0 shimming coil element (iPRES(1)) which allows both a DC current (blue or inner line) and RF current (red or outer line) to flow on the same coil element 10e, which allows simultaneous MRI signal reception and local B0 shimming. FIG. 4B illustrates an RF coil element 10e that allows RF currents at different frequencies to flow on the same RF conductor 10c of a respective coil element 10e simultaneously to perform MRI image signal reception (outer line or red trace) and wireless data transfer at a different frequency band (inner line or orange trace). As shown in FIG. 4C, these two designs can be combined to create an MRI RF coil array assembly 10A, termed iPRES (N)-W, which can perform simultaneous MRI signal reception, B0 shimming, and wireless data transfer from the RF coil assembly 10A to the scanner 75 (FIG. 1). The inductors, L (20) and Lchoke (22), in the schematics allow DC and wireless currents to flow on the coil element 10e and prevent or reduce RF losses incurred to the DC power supply 30. As will be discussed further below, the DC power supply can be provided adjacent the side of the wireless module 120 as a battery pack module 30m (with rechargeable MRI compatible batteries 30b), or be an external DC power supply 30 (FIG. 3D, 7, 9, 13).

FIGS. 4C, 5A and 5B also illustrate that outputs of the wireless module 120 can be connected to DC power lines 138, one for a positive polarity and one for a negative polarity. The DC power lines 138 can each comprise an Lchoke 22 positioned between the wireless module 120 and the RF conductor 10c of a respective coil element 10e, which RF-isolate the module 120 from the coil and maintain the MRI image SNR.

The RF coil assembly 10A can use the general purpose input/output (GPIO) connections 120c (i.e., pins) as the input and outputs 120i, 120o of the wireless module 120 to provide a DC control voltage to, for example, activate one or more sensors 44 as peripheral devices 308 on a coil element 10e or other part of the RF coil assembly 10A, activate or communicate with one or more peripheral devices 308 on the coil assembly 10A (FIG. 5A).

In some embodiments, one or more of the GPIO connections 120c of the wireless module 120 can also be used to control switch modules 50 in coil elements 10e to perform adaptive B0 shimming (FIG. 5B). The GPIOs 120i, 120o can be used during adaptive shimming to activate the switch module 50 that distributes a DC current to N-interior shim loops (where N is typically between 2-12 for respective coil elements 10e to select which or how many interior shim loops to activate or deactivate), as well as to provide the DC current needed for B0 shimming (shown in green and blue, for internal DC shim loops 10DC$_1$, 10DC$_2$ including an outer perimeter of the RF conductor and internal lines about the switch module 50 through Lchokes).

FIG. 6A illustrates the RF coil assembly 10A with the attached or "on-board" wireless chip module 120 that modulates and transmits, or receives, data obtained via the RF coil assembly 10A, typically directly, to an antenna 175a as an AP 175 mounted inside the MRI scanner room 100A, which then delivers the data to the scanner console or an external computer 275.

For example, data is wirelessly transferred: to acquire MRI data, to obtain information from sensors for physiological monitoring (i.e. heartbeat and breathing), from a camera for motion tracking, or from NMR probes for far field monitoring, to present visual, auditory, or somatosensory stimuli to, or record responses from, subjects during functional MRI, to perform localized B0 shimming, or to detune a radio-frequency (RF) receive coil array during pulse sequence RF transmit periods. Conventionally, all of these data are transferred through a network of wired connections, which can add significant complexity to the system.

Figure 6B:
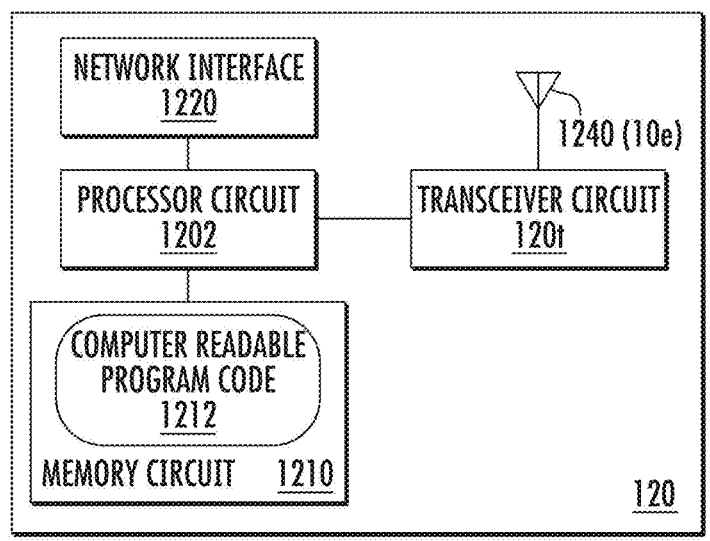
FIG. 6B is a block diagram of a wireless module according to embodiments of the present invention.

FIG. 6B is a block diagram of wireless module 120 that may be a MIMO module coupled to the RF coil array assembly 10A for an MRI system. The wireless module 120 is configured to perform operations according to one or more embodiments disclosed herein. Referring to FIG. 6B, the wireless module 120 includes a radio transceiver circuit 120t, a processor circuit 1202, and a memory circuit 1210 containing computer readable program code 1212. The processor circuit 1202 may include one or more data processing circuits, such as a general purpose and/or special purpose processor, e.g., microprocessor and/or digital signal processor that may be collocated or distributed across one or more networks. The processor circuit 1202 can be configured to execute the computer readable program code 1212 in the memory 1210 to perform at least some of the operations and methods of described herein as being performed by the wireless module 120. Antenna hardware 1240 may be used for signal propagation. The antenna hardware 1240 can be provided as Multiple Input, Multiple Output (MIMO) antenna elements 10e. That is, the RF coil elements 10e can provide the only antenna elements (resonant elements) required for the antenna hardware 1240 of the wireless module 120 and any antenna hardware provided with a standard wireless chip package may be disabled or disconnected. In other embodiments, the wireless module 120 may also have operative antenna hardware used with the RF coil elements 10e as wireless data antennas. The network interface 1220 is coupled to the processor circuit 1202 and communicates with the controller of computer or control console 275 of FIGS. 1A, 1B and/or 1C, for example.

Figure 7:
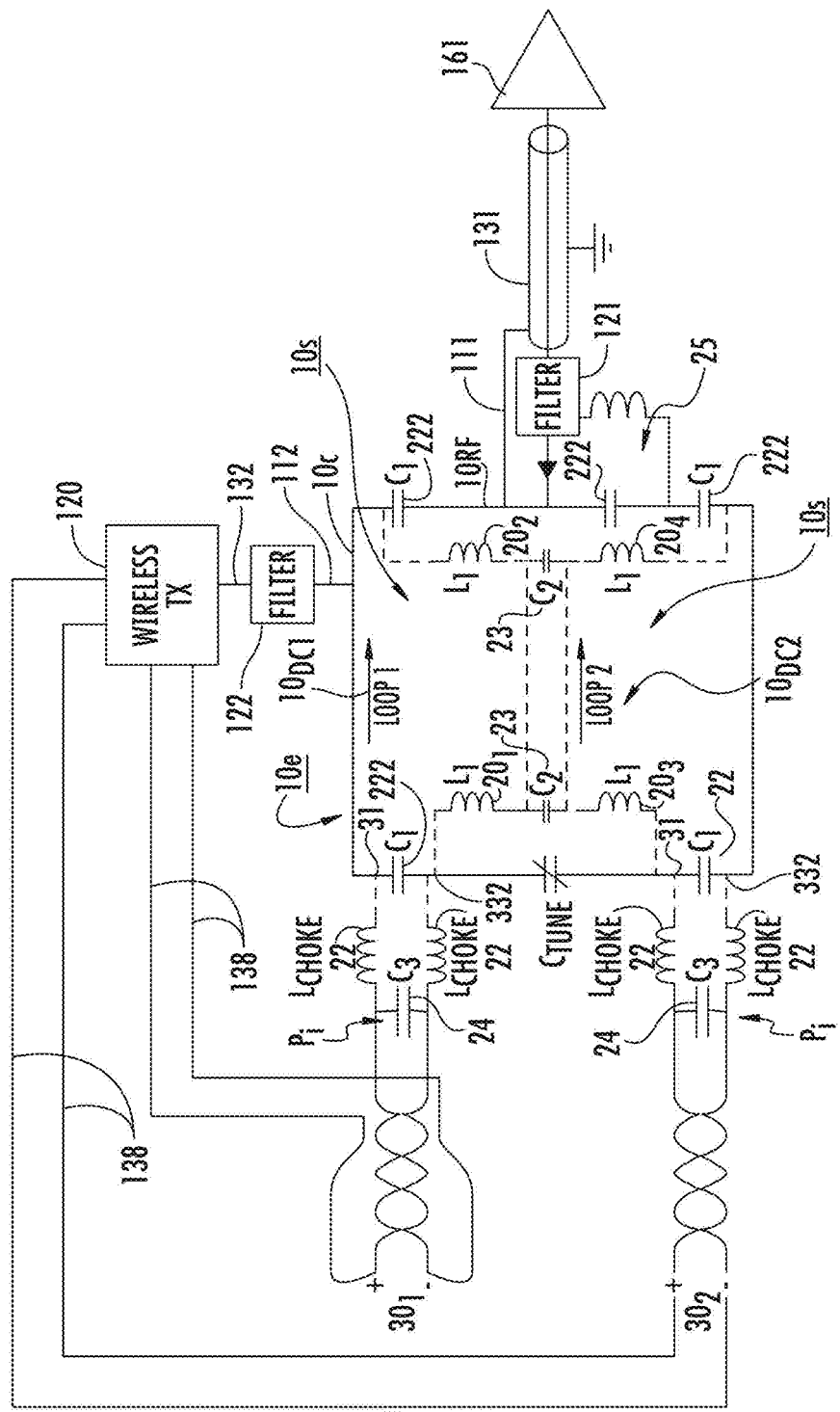
FIG. 7 is a schematic illustration of an RF a coil element of an RF coil assembly that can operate with split DC (direct current) loops according to embodiments of the present invention.
Figure 9:
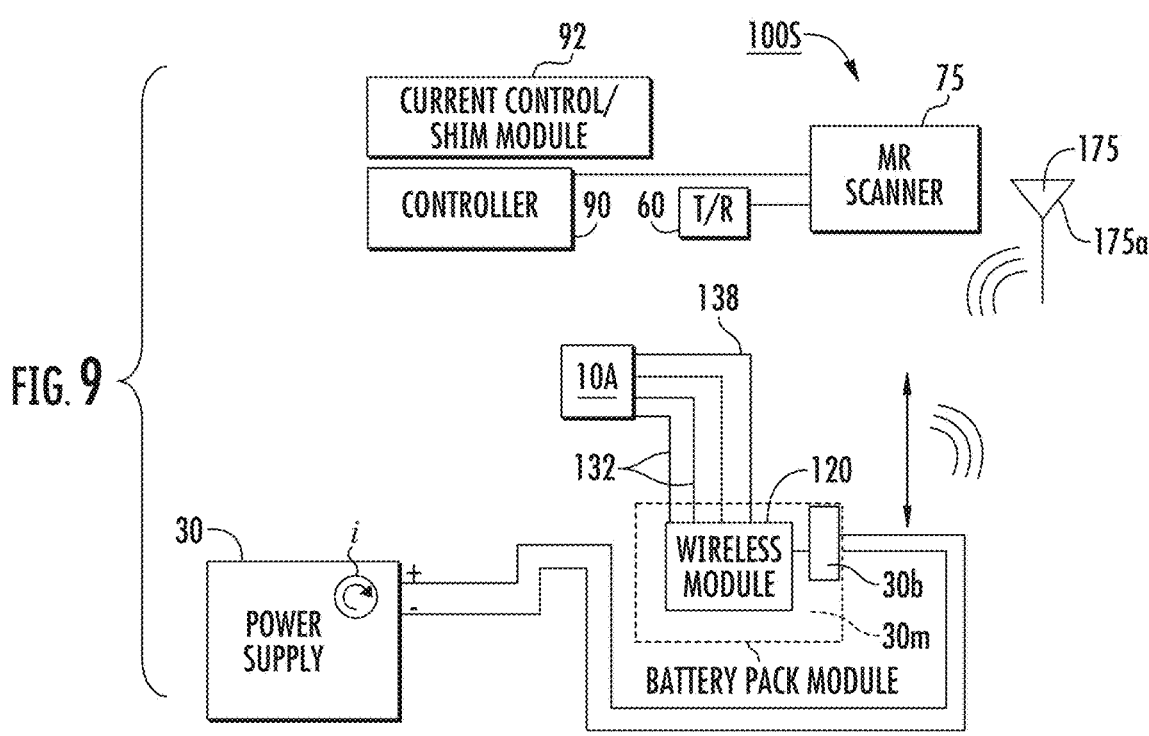
FIG. 9 is a schematic illustration of an MRI scanner system with an MR scanner and an RF coil array assembly with an onboard wireless module according to embodiments of the present invention.

As shown in FIG. 7, the coil elements 10 can be in communication with a DC power supply 30, along with inductors $L_1$ 20, which can be placed in shunt with (the existing) capacitors 222 or with at least one capacitor 222 in at least one LC resonance circuit 25, to provide an RF-transparent path for a respective DC current loop 10DC (broken line trace in FIG. 7), thereby generating a local magnetic field that can be used for $B_0$ shimming Additional inductors Lchoke 22 can be placed between the wireless module 120 and the RF coil element 10e as high-impedance RF chokes to prevent current loss and to maintain the same RF performance. The circuit 10c can electrically communicate with one or more pre-amplifiers 161 (FIG. 4B) and/or T/R switch 60 (FIG. 9).

The DC power supply 30 can be connected to the wireless module 120 and can be connected at positive and negative terminals (e.g., connections), respectively to form a closed DC loop $10_{DC}$ that allows a DC current to circulate in the coil element 10e to generate a local $B_0$ magnetic field. The closed loop DC circuit 10DC is illustrated by the broken line residing on the top and bottom of the outer perimeter line in FIG. 7 and the outer solid rectangular perimeter line in FIG. 6. Current can circulate in either direction and can be individually adjusted for each coil element 10e or sets of coil elements in respective coil arrays to allow for controlled shimming to produce a uniform $B_0$ field using the local $B_0$ fields.

FIG. 7 illustrates that a respective RF coil element 10e can be configured to have "split" DC loops so as to have more than one DC loop 10DC to thereby increase spatial resolution by increasing the number of magnetic fields available for $B_0$ shimming within a respective RF coil (element) 10e.

Figure 8:
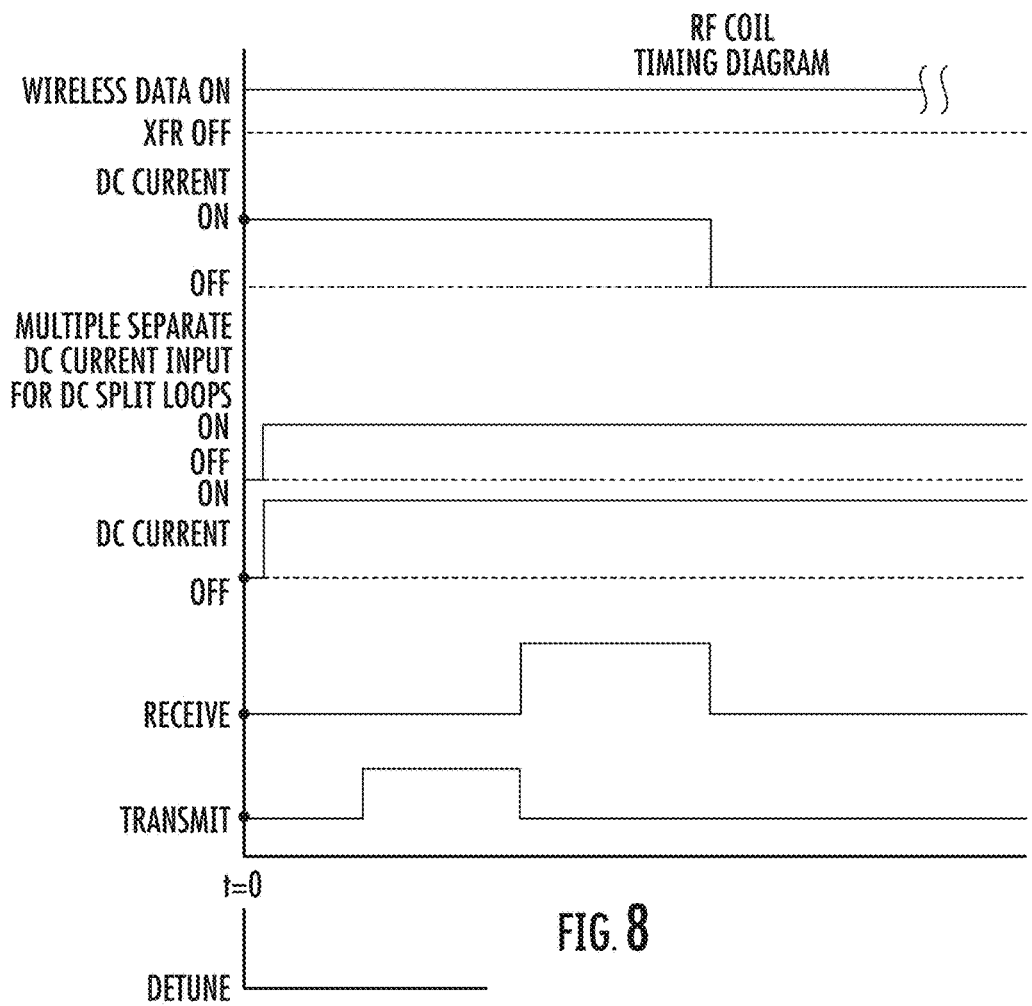
FIG. 8 is an example of a timing diagram according to embodiments of the present invention.

The coil element 10e can be in any shape or geometry to form a continuous path for the DC current, e.g., a continuous path shaped as a circle, square, rectangle, triangle, figure-8, etc. Thus, the term "loop" is used broadly to refer to a closed or substantially closed, electrically continuous path that can circulate DC current in a desired direction, e.g., clockwise or counterclockwise. The coil element 10e can be formed as a single layer of wire or conductor or multiple stacked layers of wire or conductor. Different coil elements of a single array 10A can have different geometries or the same geometries. Different cooperating RF coil arrays (where more than one RF coil array is used) can have the same or different element geometries.

The split DC loop configuration adds flexibility to increase the number of DC loops 10DC within a respective RF coil element 10. The split DC loops 10s can be used to adjust the DC loop size and shape and/or allow individual ones of the split DC loops to be independently adjustable for DC current flow for shimming which may improve the local $B_0$ shimming capability. The term "split DC loop" and derivatives thereof refer to an RF coil element conductor (e.g., RF conductor circuit loop) that is electrically partitioned (e.g., split) into multiple, smaller DC loops 10DC using an RF-specific system of components (inductors and capacitors) that can substantially maintain the same RF performance of a respective RF coil element.

Each of the split DC loops of a respective coil/coil element 10e can use an independent DC current to create different magnetic fields within the RF coil/coil element. In some embodiments, they may use a different DC power supply. In some embodiments, some or all of the split DC loops of a respective RF coil element can share a common DC power supply.

FIG. 7 illustrates, by way of example only, that the split DC loops 10s of a respective coil element 10e can include first and second separate DC loops $10DC_1$, $10DC_2$ within a single RF coil element 10. The red (darker) perimeter rectangle is the RF current loop 10RF and the broken-line perimeters (blue) of two smaller loops represent the independent DC current loops, Loop 1, and Loop 2, $10DC_1$, $10DC_2$, respectively. Optionally, two independently controllable DC power supply inputs $30_1$, $30_2$ can be used to drive the two split DC loops $10DC_1$, $10DC_2$ independently.

The RF coil element 10e can include at least four spaced apart inductors $L_1$ $20_1$-$20_4$, at least two for each DC loop $10DC_1$, $10DC_2$, can be employed to provide the two separate DC paths $10DC_1$, $10DC_2$ about the RF coil element 10e, creating two local, independent magnetic fields that can be used for $B_0$ shimming.

Capacitors $C_2$ 23 can be positioned between pairs of inductors $L_1$ $20_1$, $20_3$ and between pairs of inductors $L_1$ $20_2$, $20_4$ of each different DC current loop paths $10DC_1$, $10DC_2$ to electrically isolate the two DC current paths and/or to separate and form adjacent cross-segments of the different DC current paths $10DC_1$, $10DC_2$. The capacitors $C_2$ 23 are shown as two capacitors $C_2$, but may be provided as more than two, and are added in shunt between the two DC loops to provide additional RF isolation.

The pairs of terminals 138 for DC power input to the RF coil element 10e can be closely spaced to opposing sides of the at least one capacitor 222 of the LC resonant circuit segment 25 (FIG. 5A) which can be facilitated by using a DC twisted pair for connection.

Circuit components, such as a Pi network, i.e., a capacitor $C_3$ 24 can be placed in shunt between two chokes, $L_{choke}$ 22, to increase the isolation between the DC power supplies $30_1$, $30_2$ and the RF coil element 10e, substantially or totally maintaining the S-parameters of the original RF coil 10. The DC current from the respective DC power supplies $30_1$, $30_2$ can pass through the inductors Lchoke 41, 42 while the Pi network acts as an RF bandstop filter.

The implementation of the split DC loops 10s in a respective coil element 10e can be either static or dynamic, in which case the size and shape of the DC loops, e.g., $10DC_1$, $10DC_2$, can be adjusted as needed, resulting in an even higher flexibility for $B_0$ shimming.

A dynamic implementation can be achieved by using switch modules 50 (FIG. 5B), such as, but not limited to, FET switches. In this "simple" example, when the FET switches are off (high impedance), the coil 10 has the same two-loop configuration $10DC_1$, $10DC_2$ shown in FIG. 2. When a voltage is applied gate-to-source of the FET, the FET switches can produce four (smaller) DC loops $10_{DC}$ with DC currents based on the internal and any added resistance (not shown) at the switches. This switchable design can be extrapolated to use multiple switches for additional DC current paths, amplitudes, and geometries.

Although described using FET switches, diodes, DPDT switches, or combinations thereof and/or other circuit switch components may be used.

Coil elements of a respective RF coil or RF coil array can include combinations of single DC loops 10DC, split static and split dynamic DC loops 10DC for different coil elements or sets of coil elements. Different coil elements may have different numbers of split DC loops 10s or the same number of split DC loops 10s.

A RF coil element 10e with a split DC loop configuration 10s (FIG. 5B) can be in communication with at least one battery module 30m (FIG. 3D, 13) with one or more non-ferromagnetic rechargeable batteries 30b (FIG. 9, 12, 13) providing the DC power supply 30. The one or more battery module 30m can include variable resistors 509 (FIG. 13), to allow all the loops 10s of a respective coil element 10 to be fed from the rechargeable battery module 30m as a single power supply 30 (which can be onboard the RF coil array 10A). The RF assembly 10A can have variable resistors, switches, and/or additional ICs (i.e., op amps to gain up the current output for shimming) that can be controlled and operated remotely and wirelessly via the wireless module 120 and one or more coil element 10e. Different current amounts or polarity can be generated in each DC loop, provided the DC power supply 30 can generate a sufficiently large total current to feed the DC loops. A Digital-to-Analog Converter (DAC) 507 (FIG. 13) can be used to provide B0 shimming current value resolution.

As noted above, the RF coil elements 10 with split DC loops 10s integrates multiple smaller DC loops within each RF coil element 10 and removes their geometric dependence on the size and shape of the RF coil element. For example, splitting each RF coil element of a 32-channel head coil array into two DC loops, yields 64 independent smaller DC loops that can be used for $B_0$ shimming. When dynamic switching is employed, this can be extended to 128 independent loops, for example. The split loop 10s coil design can increase the number of degrees of freedom and the spatial resolution available for $B_0$ shimming, resulting in a more effective shimming of localized $B_0$ inhomogeneities with spatial variations smaller than the size of the RF coil.

In the switched implementation, the flexibility to tailor the configuration of the DC loops 10DC to specific $B_0$ inhomogeneities may be further improved. While switched DC loops have been implemented previously into a separate shim coil array, they have not been implemented into an integrated RF/shim coil array, losing the advantages gained by having both the shim and RF coils in close proximity to the subject. See, e.g., Harris C, Handler W, Chronik B, A new approach to shimming: the dynamically controlled adaptive network. Magnetic Resonance in Medicine. 71(2), 859-869 (2013), the contents of which are hereby incorporated by reference as if recited in full herein.

In addition, embodiments of the invention are suitable for all MRI systems, but may be particularly useful for high field (e.g., 3 T) or ultra-high field (e.g., 7 Tesla and above) MRI, as it can address both $B_1$ and $B_0$ inhomogeneities by allowing effective $B_1$ and $B_0$ shimming close to the imaging object and to achieve uniform $B_1$ and $B_0$ magnetic field.

It is also contemplated that, in some embodiments of the invention, the RF coils 10A with a DC mode can be configured to generate local $B_0$ fields for spatial encoding instead of for $B_0$ shimming.

Referring to FIG. 7, exemplary values of the inductors and capacitors can be, for example, $L_1$=1.2 µH, $C_1$=1000 pF, $C_2$=100 pF, $C_3$=100 pF, and Lchoke=1.2 µH. It is noted that these values as well as the implemented matching circuit are provided by way of example only and are not intended to be limiting to the new configuration as they are specific to the coil prototype and a 3 T scanner. The components and values of the components can be adjusted for any coil and field strength. Furthermore, while this proof-of-concept prototype only contained two split DC loops with a fixed configuration, other implementations can include a larger number of DC loops with or without FET or other switches to dynamically change the configuration of the DC loops.

As with the single DC loop configurations, different configurations and electrical components of split DC loops and coil elements 10e are contemplated. The width/length or diameter (average) of the RF coil element 10e can be any suitable size, typically between about 1 mm to about 30 cm and any value therebetween, such as between about 10 mm to about 15 cm, including about 1 cm, about 2 cm, about 3 cm, about 4 cm, about 5 cm, about 6 cm, about 7 cm, about 8 cm, about 9 cm and about 10 cm.

As described in Patent Application Publication WO2014/003918, the capacitor 22 in the parallel LC circuit 25 (FIG. 2) can be one or more capacitors, such as two spaced apart capacitors with an electrical ground between them. The content of this document is hereby incorporated by reference as if recited in full herein. However, other RF coil element circuit configurations may be used including more than two capacitors and more than one parallel LC circuit 25. Also, while it is contemplated that a dual tuned circuit configuration may be used, the different LC resonance circuit configurations can be configured as a multiple tuned RF circuit instead of a dual tuned RF circuit if multiple parallel LC circuits are not exactly the same between each other (i.e., they have different $L_1$ and/or $C_1$ values). The respective coil elements 10e can include at least one tuning capacitor and at least one matching capacitor.

Also, the labeling of the inductor/capacitors in the figures are for ease of discussion and the nomenclature $L_1$ and $C_1$ and the like, can mean different values for different component placement, e.g., different LC circuits in the same coil element or in a different coil element.

When DC current flows through the at least one inductor 20 of the different split DC loops 10s, RF signal flows primarily across the corresponding capacitor 22 of the at least one LC resonant circuit 25. That is, RF signal flows primarily across the capacitor but (e.g., a very small portion of) RF signal may still flow across the inductor in parallel but does not interfere with the DC mode.

The Lchokes can be sized and configured to prevent the propagation of RF currents. The RF chokes can be used to block AC while passing DC.

An RF/Lchoke is typically a coil of insulated wire and can be used as a passive inductor which blocks higher-frequency alternating current (AC) in an electrical circuit while passing signals of much lower frequency and direct current (DC). Embodiments of the invention use a self-resonant frequency (SRF) of MR compatible inductors to provide the isolation. However, it is contemplated that circuit configurations may operate in an appropriate manner without Lchokes, although B0 shimming using the coil elements 10e may not be carried out without the chokes.

As is well known to those of skill in the art, the term "RF Balun" refers to the common-mode choke in RE coils. It presents low impedance to the signal current, which is in differential mode and allows DC coupling. To the common mode current it presents itself as a high impedance choke. A balun can be placed between the RF coil and the transmission line (TL) to reduce common mode RF currents on the TL outer conductor. The common mode current on the TL outer conductor generates unnecessary coupling between adjacent coils, which adds to signal noise, and heating of the RF coils and assorted electronics. A balun reduces common mode RF currents (i.e. ~ creates a balanced coil) and enables TEM waves at the Larmor frequency to propagate within the TL for MRI signal reception/transmission. In addition, the balun, by eliminating currents on the TL outer conductor, defines the coil resonant structure to be used for MRI signal reception. The MRI RF signal can be readily received after the balun by the MRI system through a Transmit/Receive switch 60 that connects directly or indirectly to the MR Scanner 75 (FIG. 9) as is well known.

The SRF of the Lchoke (or L) allows DC current to flow on the coil element 10*e* and provide RF isolation between the element 10*e* and the DC power supply 30. The feed structure can be bypassed using, for example, L1 in FIG. 7 (to be clear, Lchoke is not a balun). As a result, both the RF and DC currents can flow on the same coil element 10*e* structure simultaneously (and independently) with no interference from each other.

The DC current provided to any individual coil element 10*e* for $B_0$ shimming can be any suitable value, typically between about 0-30 A, and can be adjustable to flow in either direction in the split DC current loops 10*s*, preferably but not required, with each split loop being adjustable in the amount of current. To clarify, any suitable DC current can be used, e.g., between about 0-50 A (amperes), typically between about 1-30 A, or above 30 A or even above 50 A. In some embodiments the DC current is about 1 A, about 2 A, about 3 A, about 4 A, about 5 A, about 6 A, about 7 A, about 8 A, about 9 A, about 10 A, about 11 A, about 12 A, about 13 A, about 14 A, about 15 A, about 16 A, about 17 A, about 18 A, about 19 A, about 20 A, about 21 A, about 22 A, about 23 A, about 24 A, about 25 A, about 26 A, about 27 A, about 28 A, about 29 A, about 30 A, about 35 A, about 40 A, or about 50 A. In some embodiments the DC current for a respective split DC loop can exceed the 50 A exemplary range. The recited current range and values are by way of example only.

Exemplary values for certain circuit features are provided below by way of description only, without being limited to the ranges for the various components of a coil element 10*e*.

At 3 T, the circuit of a respective coil element 10*e* can have a Larmor frequency of about 128 MHz. General ranges of components for 3 T operation include: inductor Lchoke or L1 ranges from 50 nH to 2.5 uH with a self-resonant frequency (SRF) at the Larmor frequency, L2 ranges from 300 nH to 2.5 uH, Cf range (0-30 pf), Cm ranges (0-30 pf), RF balun (inductor=100 nH to 2.5 uH, capacitor=0-30 pf, bandstop filters 121, 122 that provide isolation at the wireless communication operational frequencies and the Larmor frequency (127.7 MHz) respectively.

For isolation, SRF is can be an important metric while the inductance, if not too large, may be a secondary consideration. It is noted that the bandstop filters 121, 122, for isolating the two different RF ports 112, 111 (FIG. 2) are not conventional for MRI, especially not in a coil array 10A.

At 1.5 T, the coil element 10*e* can have an operational (Larmor) frequency of about 64 MHz. The general ranges of components at 1.5 T can be: inductor (Lchoke or L1) ranges from 100 nH to 2.5 uH with a SRF at the Larmor frequency, L2 ranges (300 nH to 2.5 uH, Cf range (0-40 pf), Cm ranges (0-40 pf), RF balun (inductor=200 nH to 2.5 uH, capacitor=0-40 pf), bandstop filters 121, 122 that provide isolation at the wireless communication operational frequencies and the Larmor frequency (64 MHz) respectively.

At 7 T, the coil elements 10*e* can a Larmor frequency of about 298 MHz and about 63 MHz respectively. The general ranges of components can be: inductor (Lchoke or L1) ranges from 20 nH to 2 uH with a SRF at the Larmor frequency, L2 ranges from 50 nH to 2 uH, Cf ranges (0-15 pf), Cm ranges (0-15 pf), RF balun (inductor=20 nH to 2 uH, capacitor=0-15 pf) bandstop filters 121, 122 that provide isolation at the wireless communication operational frequencies and the Larmor frequency (298 MHz) respectively.

FIG. 8 is an exemplary timing diagram showing that the DC mode with separately adjustable current for respective DC loops of RF coil elements with split loops 10*s* can be longer than either the transmit or receive RF modes and can be continuous (second line) or discontinuous (upper line). However, the wireless communication is decoupled from the scanner so it can be performed or "on" at any time.

Figure 12:
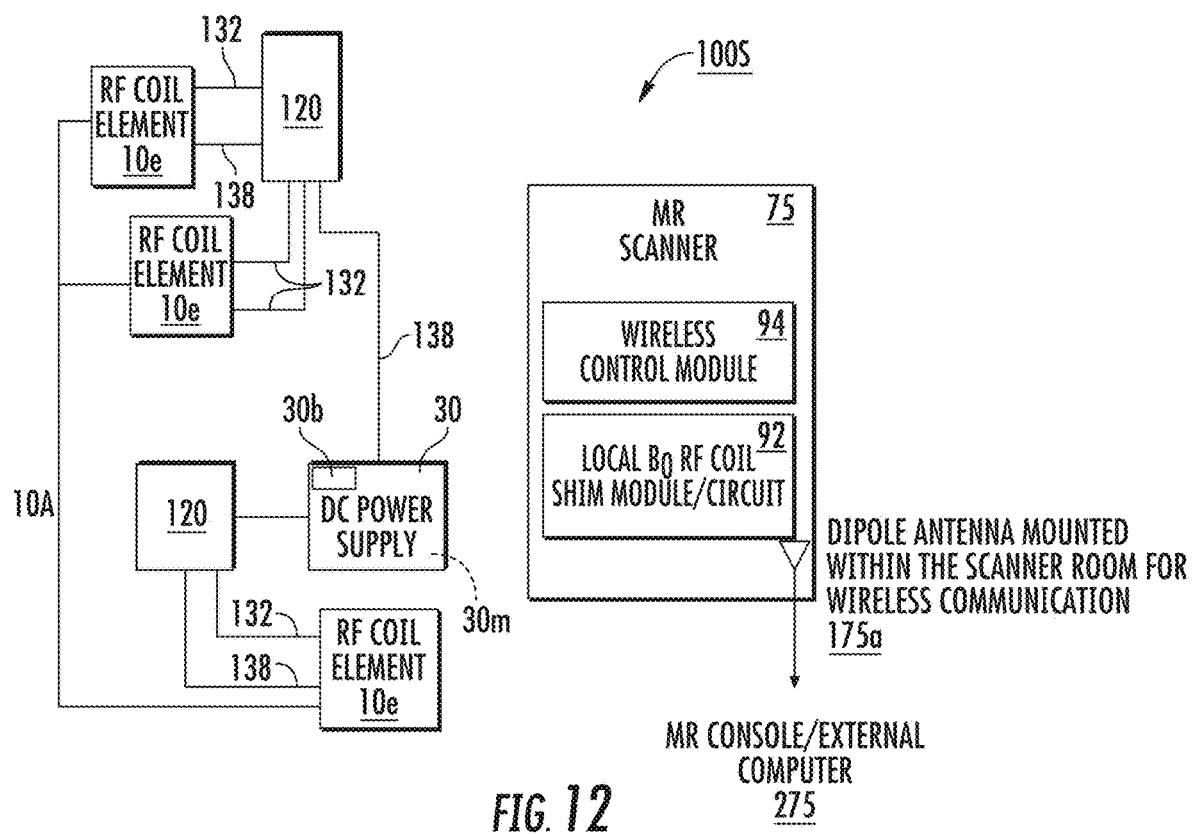
FIG. 12 is a schematic illustration of an MRI scanner system according to embodiments of the present invention.

FIG. 9 and FIG. 12 are schematic illustrations of an MRI system 100S illustrating an RF coil assembly 10A with a wireless module 120 that wirelessly directly communicates with an in-room 100A dipole antenna 175*a* of an AP 175.

FIG. 9 shows by a rechargeable battery module 30*m*. The battery module 30*m* can be coupled to a power source/supply 30 for recharging the rechargeable batteries 30*b*, such as a DC power source or AC power source, optionally a standard AC wall outlet as the power source.

Figure 13:
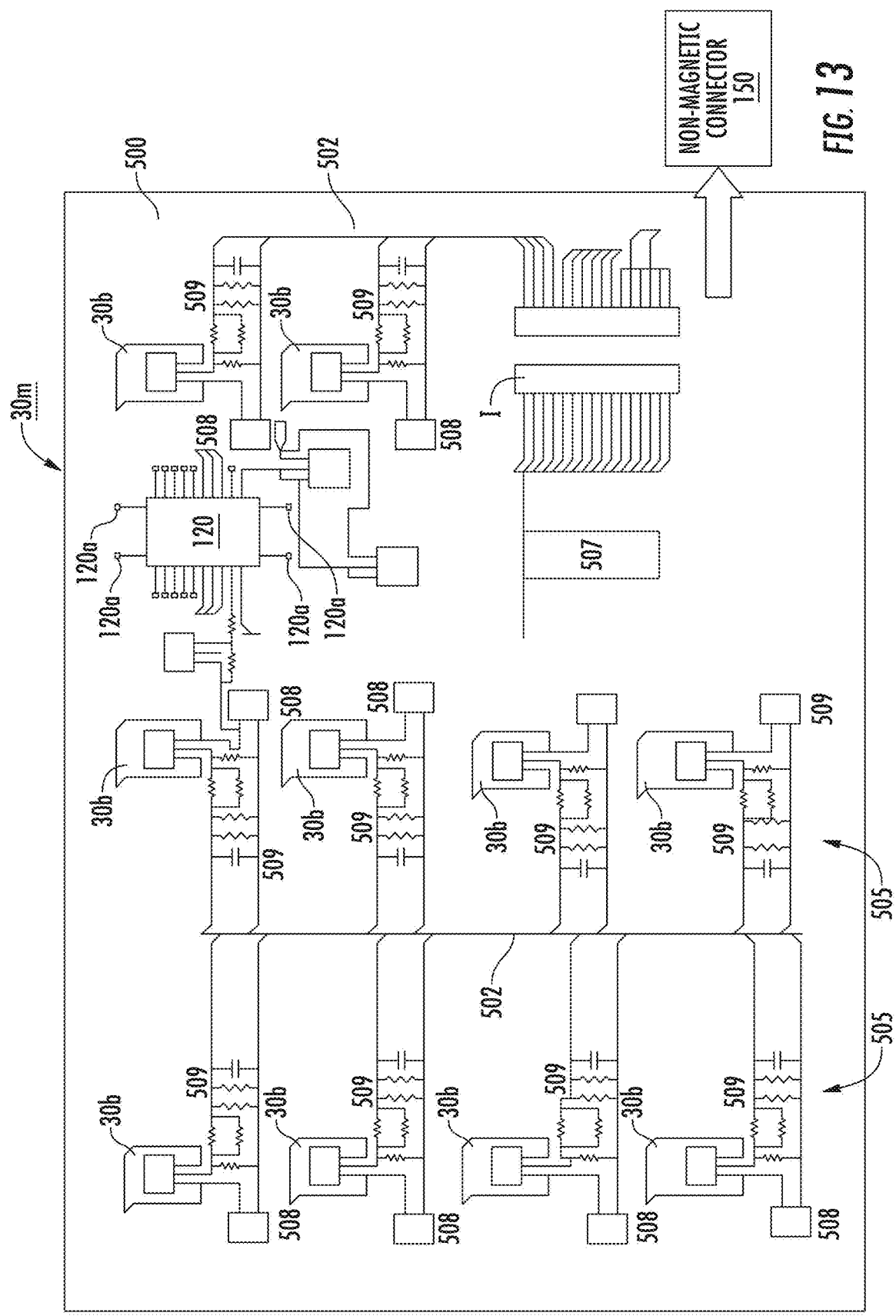
FIG. 13 is a schematic circuit illustration of a battery pack module according to embodiments of the present invention.

FIG. 13 illustrates that the battery module 30*m* can be held on a common substrate (i.e. PCB) 500 with the wireless module 120. The substrate 500 can be a flexible, semi-rigid or rigid PCB. FIG. 13 also illustrates that the wireless module 120 can be provided as a plurality of spaced apart wireless modules (wireless chips) and a plurality of rechargeable batteries 30*b*.

Figure 14:
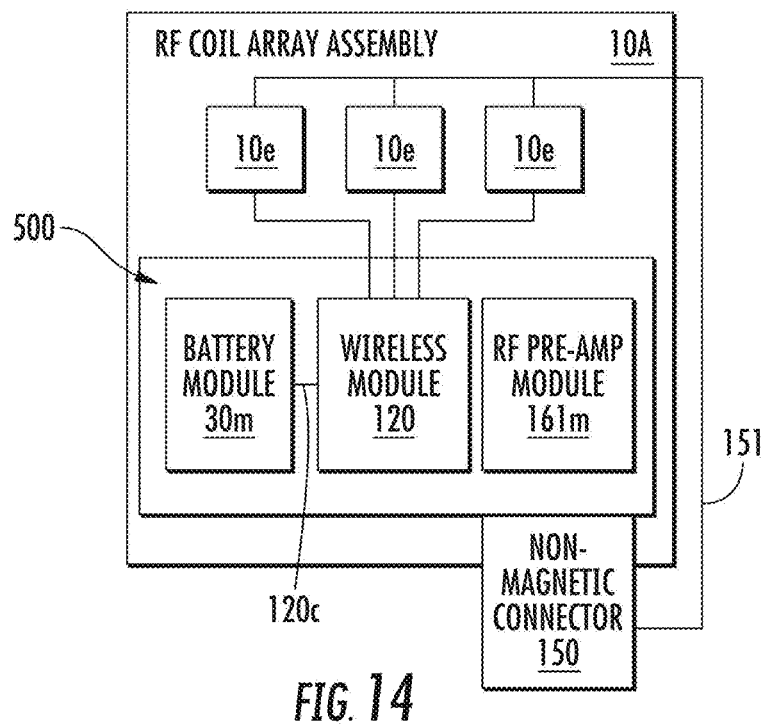
FIG. 14 is a schematic illustration of an RF coil assembly according to embodiments of the present invention.

Referring to FIGS. 13 and 14, the DC power supply 30 can be a rechargeable MRI compatible battery module 30*m* with a plurality of rechargeable MRI-compatible batteries 30*b* (non-ferromagnetic batteries). The battery pack module 30*m* can be provided in a compact package and integrated with, attached to or placed adjacent the wireless module 120. The battery pack module 30*m* can be used to supply voltage to: power the wireless module 120, provide the DC currents for the coil elements 10*e* used to perform B0 shimming, and/or activate additional ICs or peripheral devices (i.e., op amps, control switches, etc). The battery module 30*m* can connect to the RF coil assembly 10A via an MRI compatible (non-ferromagnetic) connector 150, optionally a configurable connector 150. The configurable connector 150 can be a non-magnetic (MRI compatible) ODU-MAC® non-magnetic connector from ODU-USA, Inc., Camarillo, Calif.

The wireless module 120 can be integrated into the battery module 30*m* to provide both RF and DC connections to the RF coil 10A. The battery module 30*m* can have a substrate (i.e., a PCB) 500 that holds a plurality of rechargeable batteries 30*b*, the wireless module 120, switches and an electronic connection interface I (or "header") that connects to the non-magnetic connector 150 that can be fixedly or releasably attachable to the coil elements 10*e*. Bus lines 502 indicate connections between the wireless module 120, the rechargeable batteries 30*b*, and control switches 505 of the different batteries 30*b* through I to promote wireless control of the module 30*m* (for example, during B0 shimming). One or more of the batteries 30*b* can power the wireless module 120. The battery module 30*m* can hold any suitable number of rechargeable batteries 30*b*, typically in a numerical range of 1-30, although shown as 10.

The battery module 30*m* can be adaptable to accommodate different coil assembly configurations with different numbers of coil elements 10*e*. For example, the batteries 30*b* can connect to different numbers of coil elements 10 and provide DC power input to different numbers of coil elements 10e, such as between about 2-500, typically between 2-150, more typically between 20-100.

The module 30m can include one or a plurality of RF transmission lines for RF wireless data transfer such as via antenna connections 120a.

FIG. 13 illustrates multiple antenna inputs 120a associated with MIMO but a single antenna input 120a may also be used for SISO as will be understood by one of skill in the art.

The battery module 30m may also include a DAC (digital to analog converter) 507, op amps 508 and (programmable) resistors 509 as shown in FIG. 13. The op amps 508 (operational amplifiers) can comprise a DC-coupled high-gain electronic voltage amplifier with a differential input and may be packaged as components, or used as elements of more complex integrated circuits (IC).

In some particular embodiments, the connector 150 can be configured to have up to 90 (DC) connections to the RF coil array assembly 10A and connect to different coil elements 10e and/or have multiple RF connections to coil elements 10e to perform MIMO wireless communication.

FIG. 14 illustrates an exemplary RF coil assembly 10A with the coil elements 10e coupled to the wireless module 120 and the battery module 30m, both held on a common substrate 500, which can be a PCB, and that can optionally also hold an RF pre amp module 161m. The pre amp module 161m can include a plurality of preamps 161 and may be powered by the rechargeable batteries 30b. Further, the bias required to provide active detuning during the transmit cycle of the scanner to protect the preamps 161 held by the preamp module 161m can be supplied by the rechargeable batteries 30b. The timing to active the bias for detuning is relayed via the wireless data connection between the scanner and coil element 10e. The connector 150 is coupled to the substrate (i.e., PCB) 500 and has at least one external connection line 151 that is attached to one or more coil elements 10e.

Figure 15:
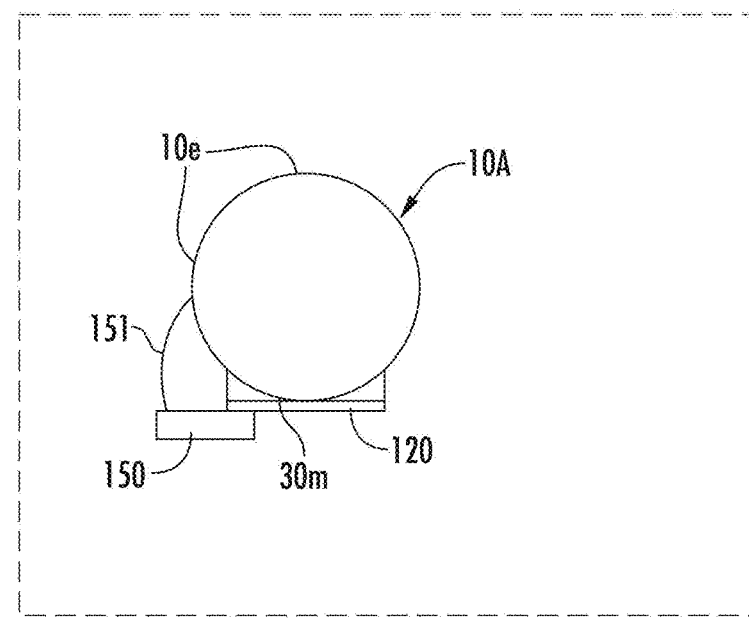
FIG. 15 is another schematic illustration of an RF coil assembly according to embodiments of the present invention.

FIG. 15 is another exemplary schematic illustration of an RF coil assembly 10A which illustrates the battery module 30m with the rechargeable batteries and wireless module coupled or adapted to be coupled to the connector 150 which is coupled to coil elements 10e.

It is contemplated that, in some embodiments, the RF coil assembly 10A with the wireless module 120 (optionally also with the rechargeable batteries 30b) can be backwards compatible with conventional MRI systems to be able to convert wired systems with the new wireless systems simply by replacing the coil assemblies used and updating scan protocols/software.

It is contemplated that $B_0$ shimming can be optimized based on the type, shape, geometry, and location of each coil element 10. Also, as noted above, the (shimming) circuits can be configured to individually adjust amplitude and timing of DC current in each RF coil element, typically in each split DC loop of each RF coil element. See, e.g., Vaughan et al. 9.4 T human MRI: preliminary results, Magn Reson Med 2006; 56:1274-1282; and Setsompop et al., Parallel RF transmission with eight channels at 3 Tesla. Magn Reson Med 2006; 56:1163-1171, the contents of which are hereby incorporated by reference as if recited in full herein.

If available, the spherical harmonic (SH) shim coils in the original MRI scanner 75 can further be used to complement the local $B_0$ shimming. To achieve an effective $B_1$ shimming, the same kinds of coil characteristics in each coil element 10e can also be independently adjusted. It is contemplated that engineering design involving both DC and RF aspects of the coil array 10A can be integrated together to optimize the $B_0$ and $B_1$ fields, and can be widely applicable to a variety of coil shapes and geometries designed for different applications. These coil shapes and geometries include those for imaging the brain, for cardiac imaging, and musculoskeletal and other biological and physiological systems. See, e.g., Wiggins et al., 32-channel 3 Tesla receive-only phased-array head coil with soccer-ball element geometry. Magn Reson Med 2006; 56:216-223; Gräßl et al., Design, evaluation and application of a modular 32 channel transmit/receive surface coil array for cardiac MRI at 7 T, In: Proceedings of the ISMRM 20th Annual Meeting, Melbourne, 2012. p 305; and Kraff et al., An eight-channel transmit/receive multipurpose coil for musculoskeletal MR imaging at 7 T. Med Phys 2010; 37:6368-6376, the contents of which are hereby incorporated by reference as if recited in full herein.

The RF coil arrays 10A can be used with other RF coils. For example, a head coil with the RF coil array 10A can be used with conventional whole body coils or chest coils.

Figure 10:
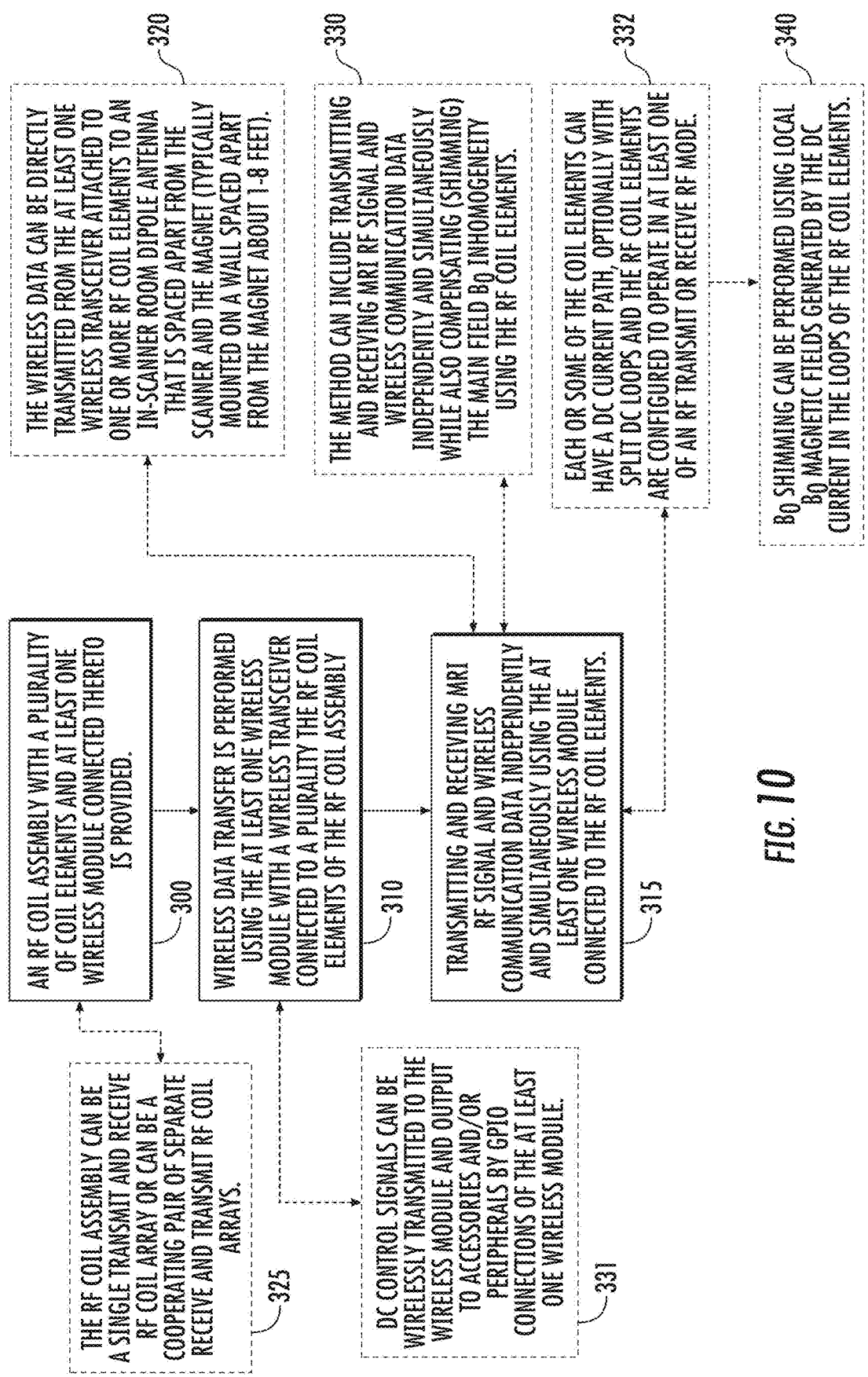
FIG. 10 is a flow diagram of exemplary steps that can be used to shim a magnet according to embodiments of the present invention.

In some embodiments, an exemplary method of operating an MR Scanner with wireless data transmission is shown in FIG. 10. An RF coil assembly with a plurality of coil elements and at least one wireless module connected thereto can be provided (block 300). Wireless data transfer is performed using a wireless module with a wireless transceiver connected to a plurality the RF coil elements of the RF coil assembly (block 310).

The method can include transmitting and receiving MRI RF signal and wireless communication data independently and simultaneously (block 315). The RF coil can be a single transmit and receive RF coil array or can be a cooperating pair of separate receive and transmit RF coil arrays (block 325).

The wireless data can be directly transmitted from the at least one wireless transceiver attached to one or more RF coil elements to an in-scanner room dipole antenna that is spaced apart from the scanner and the magnet (typically mounted on a wall spaced apart from the magnet about 1-8 feet) (block 320).

The method can include transmitting and receiving MRI RF signal and wireless communication data independently and simultaneously while also compensating (shimming) the main field $B_0$ inhomogeneity using the RF coil elements (block 330).

DC control signals can be wirelessly transmitted to the wireless module and output to accessories and/or peripherals by GPIO connections of the wireless module (block 331).

Each or some of the coil elements can have a DC current path, optionally with split DC loops, and the RF coil elements can be configured to operate in at least one of an RF transmit or receive RF mode (block 332).

DC current can be circulated in the DC current path during a transmit and/or receive operation of the RF coil.

$B_0$ shimming can be performed using local $B_0$ magnetic fields generated by the DC current in the loops of the RF coil elements (block 340).

RF current can flow through the coil elements or TEM elements while the DC current flows in the DC current loops of the coil elements simultaneously and independently without electromagnetic interference between the DC current and the RF current and RF signal for the wireless data transmission can be transmitted to the wireless module from the at least some of the coil elements concurrently with current flowing the DC current loops and with RF MRI image signal flowing in the coil elements.

Each coil element can be individually adjusted to have a desired level of DC current flow. The DC current in respective coil elements can be between about 0 to about 30 amps "A". The upper DC current level can be above 30 A as discussed above, as the range 0-30 A is only an exemplary range.

The method can include $B_1$ shimming, while $B_0$ shimming, using the generated local $B_1$ magnetic fields from the coil elements of the RF coil.

Referring again to FIG. 8 and FIG. 1A-1C, the wireless MRI system 100S can operate in different modes or activation states, including transmit and receive. The wireless data transfer can be continuously active allowing wireless data transfer during both the scanner transmit and receive actions. By way of example: (i) the scanner console can initiate a pulse sequence, (ii) the scanner transmits the RF excitation signals, (iii) the coil elements 10e then receive MRI image signal, (iv) the MRI image signals are wirelessly transmitted from the coil elements 10e via the transceiver 120t of the wireless module 120 to the one or more dipole antennas 175a in the room as each MRI image signal of each slice is obtained, then to the scanner console 275 or a processor or computer associated therewith; and (v) wireless communication data can be transmitted to and from the wireless module and one or more coil elements 10e concurrent with the transmission of either or both of the RF excitation signals and the MRI image signals. The wireless communication data can include peripheral device information or control signals. The wireless communication data with the MRI signal data packets (which can be slice by slice image data packets) can be sent in real time or near real time (i.e., within 1-2 seconds) of image signal acquisition by the coil elements 10e. A trigger pulse can be provided by the MRI scanner to indicate the completion of each slice, which can be used to initiate wireless MRI signal data transfer while an adjacent slice undergoes the MRI protocol.

By way of another example: (i) the scanner console sets a shim protocol, which can include dynamic shimming set from each image slice or each pulse sequence, and which can include local B0 shimming using DC power input from the rechargeable battery module 30m, (ii) the scanner console can initiate a pulse sequence, optionally sending a trigger signal to the wireless module 120 which can activate control signals that direct DC power "ON" to coil elements 10e for local DC shimming (iii) the coil elements 10e then receive the shimmed MRI image signal (iv) the MRI image signals are wirelessly transmitted from the coil elements 10e via the transceiver 120t of the wireless module 120 to the one or more dipole antennas 175a in the room as each MRI image signal of each slice is obtained, then to the scanner console 275 or a processor or computer associated therewith; and (v) patient monitoring information can be wirelessly transmitted to and from the wireless module via one or more coil elements 10e concurrent with the transmission of the pulse sequence and the MRI image signals. The wireless communication data with the MRI signal data packets (which can be slice by slice image data packets) can be sent in real time or near real time (i.e., within 1-2 seconds) of image signal acquisition by the coil elements 10e.

Embodiments of the present invention may take the form of an entirely software embodiment or an embodiment combining software and hardware aspects, all generally referred to herein as a "circuit" or "module." Furthermore, the present invention may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices. Some circuits, modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller. Embodiments of the present invention are not limited to a particular programming language.

Computer program code for carrying out operations of the present invention may be written in an object oriented programming language such as Java®, Smalltalk or C++. However, the computer program code for carrying out operations of the present invention may also be written in conventional procedural programming languages, such as the "C" programming language. The program code may execute entirely on an MR Scanner computer/processor(s), partly on the MR Scanner computer/processor(s), as a stand-alone software package, partly on the MR Scanner computer/processor(s) and partly on another computer, local and/or remote or entirely on the other local or remote computer (e.g., via a server). In the latter scenario, the other local or remote computer may be connected to the MR Scanner computer through a local area network (LAN) or a wide area network (WAN), or the connection may be made to an external computer (for example, through the Internet using an Internet Service Provider).

Embodiments of the present invention are described herein, in part, with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing some or all of the functions/acts specified in the flowchart and/or block diagram block or blocks.

The flowcharts and block diagrams of certain of the figures herein illustrate exemplary architecture, functionality, and operation of possible implementations of embodiments of the present invention. In this regard, each block in the flow charts or block diagrams represents a module, segment, or portion of code, which comprises one or more executable instructions for implementing the specified logical function(s). It should also be noted that in some alternative implementations, the functions noted in the blocks may occur out of the order noted in the figures. For example, two blocks shown in succession may in fact be executed substantially concurrently or the blocks may sometimes be executed in the reverse order or two or more blocks may be combined, or a block divided and performed separately, depending upon the functionality involved.

Figure 11:
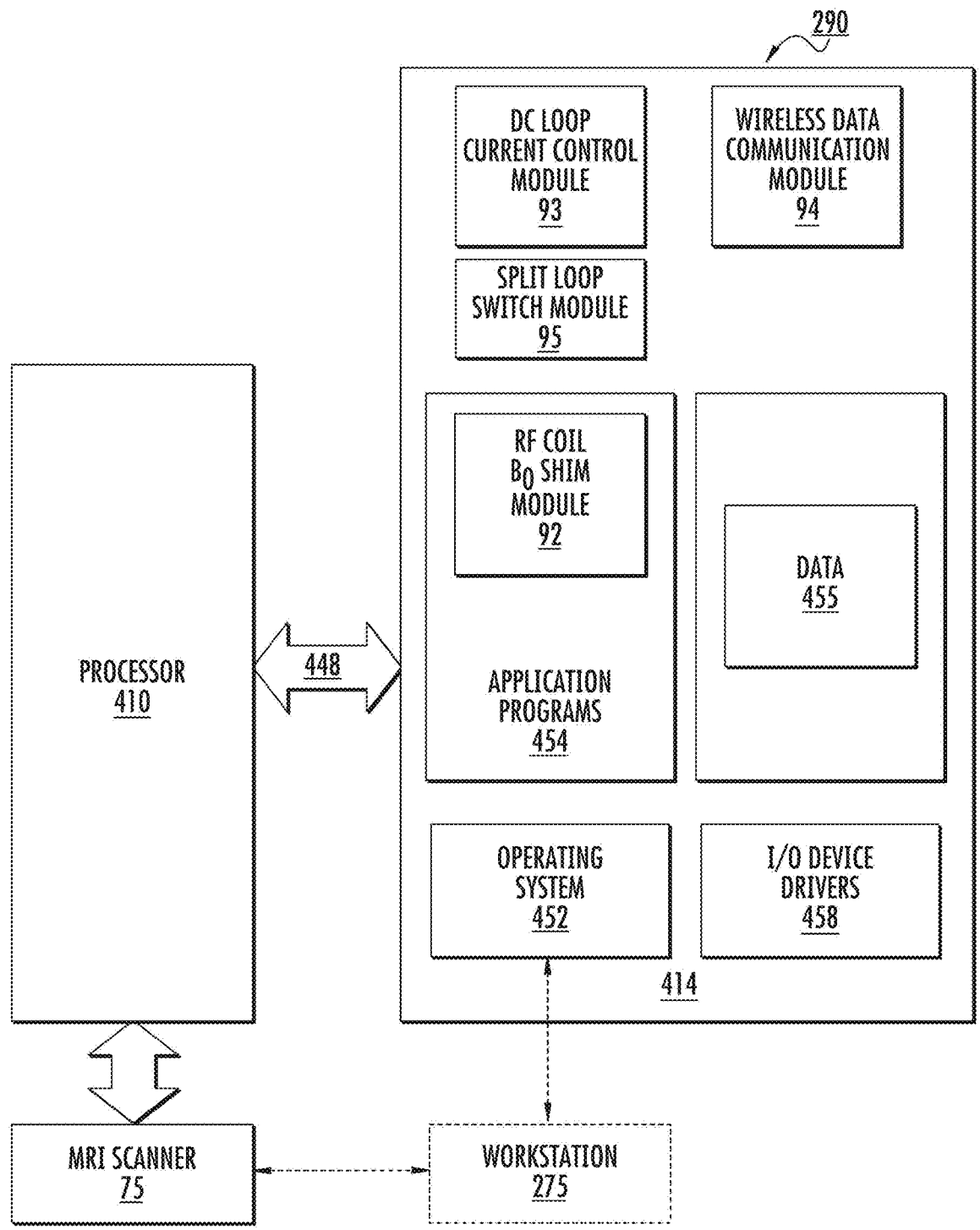
FIG. 11 is a block diagram of an exemplary data processing system according to embodiments of the present invention.

FIG. 11 is a schematic illustration of a circuit or data processing system 290. The system 290 can be used with any MR Scanners 75 and provide all or part of the modules 92, 93, 94, 95. The circuits and/or data processing systems 290 data processing systems may be incorporated in a digital signal processor in any suitable device or devices. As shown in FIG. 11, the processor 410 can communicate with (or be partially or totally onboard) an MRI scanner 75 and with memory 414 via an address/data bus 448. The processor 410 can be any commercially available or custom microprocessor. The memory 414 is representative of the overall hierarchy of memory devices containing the software and data used to implement the functionality of the data processing system. The memory 414 can include, but is not limited to, the following types of devices: cache, ROM, PROM, EPROM, EEPROM, flash memory, SRAM, and DRAM.

FIG. 11 illustrates that the memory 414 may include several categories of software and data used in the data processing system: the operating system 452; the application programs 454; the input/output (I/O) device drivers 458; and data 455. The data 455 can include magnet inhomogeneity data and desired local $B_0$ magnetic field compensation using split (static or switchable) DC current loops 10s of an RF coil array 10A. FIG. 11 also illustrates that the application programs 454 can include an RF Coil Array Local $B_0$ magnetic field shim Module 92, a separate DC loop current adjustment control Module for DC loops of respective RF coil elements 93, a wireless data communication module 94 and an optional split loop switch control Module 95 to change a respective RF coil element into having different numbers of split DC loops.

As will be appreciated by those of skill in the art, the operating systems 452 may be any operating system suitable for use with a data processing system, such as OS/2, AIX, DOS, OS/390 or System390 from International Business Machines Corporation, Armonk, N.Y., Windows CE, Windows NT, Windows95, Windows98, Windows2000, windowsxp or other Windows versions from Microsoft Corporation, Redmond, Wash., Unix or Linux or freebsd, Palm OS from Palm, Inc., Mac OS from Apple Computer, Labview, or proprietary operating systems. The I/O device drivers 458 typically include software routines accessed through the operating system 452 by the application programs 454 to communicate with devices such as I/O data port(s), data storage 455 and certain memory 414 components. The application programs 454 are illustrative of the programs that implement the various features of the data (image) processing system and can include at least one application, which supports operations according to embodiments of the present invention. Finally, the data 455 represents the static and dynamic data used by the application programs 454, the operating system 452, the I/O device drivers 458, and other software programs that may reside in the memory 414.

While the present invention is illustrated, for example, with reference to the Modules 92, 93, 94, 95 being an application program in FIG. 11, as will be appreciated by those of skill in the art, other configurations may also be utilized while still benefiting from the teachings of the present invention. For example, the Module 92 may also be incorporated into the operating system 452, the I/O device drivers 458 or other such logical division of the data processing system. Thus, the present invention should not be construed as limited to the configuration of FIG. 11 which is intended to encompass any configuration capable of carrying out the operations described herein. Further, Modules 92, 93, 94 and 95 can communicate with or be incorporated totally or partially in other components, such as an MRI scanner 75, an interface/gateway or workstation.

The I/O data port can be used to transfer information between the data processing system, a workstation, the MRI scanner 75, the interface/gateway and another computer system or a network (e.g., the Internet) or to other devices or circuits controlled by the processor. These components may be conventional components such as those used in many conventional data processing systems, which may be configured in accordance with the present invention to operate as described herein.

In some embodiments, a single RF coil array 10A can perform parallel RF transmission (with $B_1$ shimming), parallel reception, $B_0$ shimming and wireless data communication altogether.

FIG. 12 illustrates an MR Scanner system 100S with an RF coil assembly 10A comprising different coil elements 10e connected to the same wireless module 120 (top two coil elements 10e) and/or a wireless module 120 dedicated to a single coil element 10e (bottom coil element). The coil elements 10e are connected to the wireless module 120 via input and output data transmission lines 132 to GPIO connections 120c (FIG. 3A). The scanner 75 can have a wireless control module 94 (which can be in the scanner room and/or in the control room of the MRI suite 100, FIG. 1).

Embodiments of the invention will be discussed below with the non-limiting Examples.

EXAMPLES

To demonstrate the feasibility of this new design, a coil was modified per FIG. 2 to perform simultaneous MRI image acquisition at 3 T and wireless data transmission at 2.4 GHz (WiFi). Specifically, a WiFi-enabled RF coil was created by adding a high-impedance 2.4 GHz band-stop filter between the coil and the MRI transmission line to prevent 2.4 GHz signal loss to the MRI port. Likewise, a 127.7 MHz band-stop filter was placed between the coil and the WiFi transmission line to maintain the MRI signal-to-noise ratio (SNR). A readily available 802.11b/g WiFi transceiver with on-board general purpose input output (GPIO) connections was used to perform wireless data transmission between the coil and a 2.4 GHz access point (AP) placed inside the scanner room (FIG. 1A).

Two proof-of-concept experiments were performed on a 3 T scanner. In the first experiment, gradient-echo (GRE) and fast spin-echo (FSE) images of a water phantom and a healthy volunteer's hand were acquired in three conditions: 1) with the unmodified RF coil, 2) with the WiFi-enabled RF coil, but with no wireless data transmission, and 3) with the WiFi-enabled RF coil and with simultaneous wireless data transmission.

To quantify the wireless data transfer of the system, a data stream was produced by sending 1.1 kilobyte data packets from the RF coil to the AP every 2 ms. The data packet error rate (PER) and throughput were monitored via a wired AP connection to assess the data transfer before and during the image acquisitions.

The average SNR in a phantom calculated from the GRE images acquired with the unmodified coil, with WiFi integration but no data transmission, and with WiFi data transmission, was 110.3, 109.5, and 110.4, respectively.

Figure 17A:
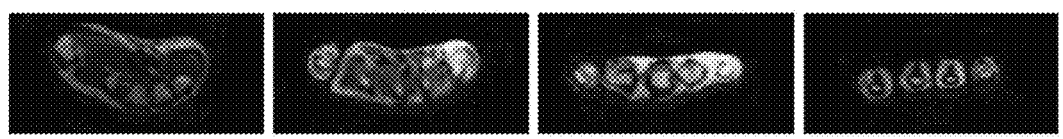
FIGS. 17A and 17B are fast spin-echo images of a healthy subject's hand.
Figure 17B:
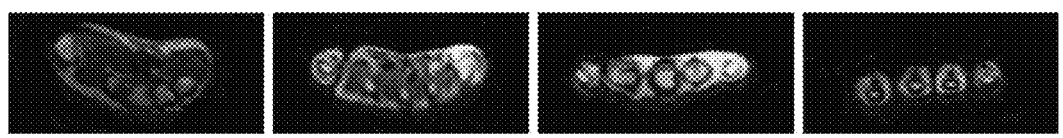

FIG. 17A and FIG. 17B are fast spin-echo images of a healthy subject's hand acquired with the WiFi-enabled RF coil while data was being transferred from the coil to the AP inside the scanner room. FIG. 17B displays no degradation in image quality when compared to images acquired without data transfer being performed per FIG. 17A.

Figure 16:
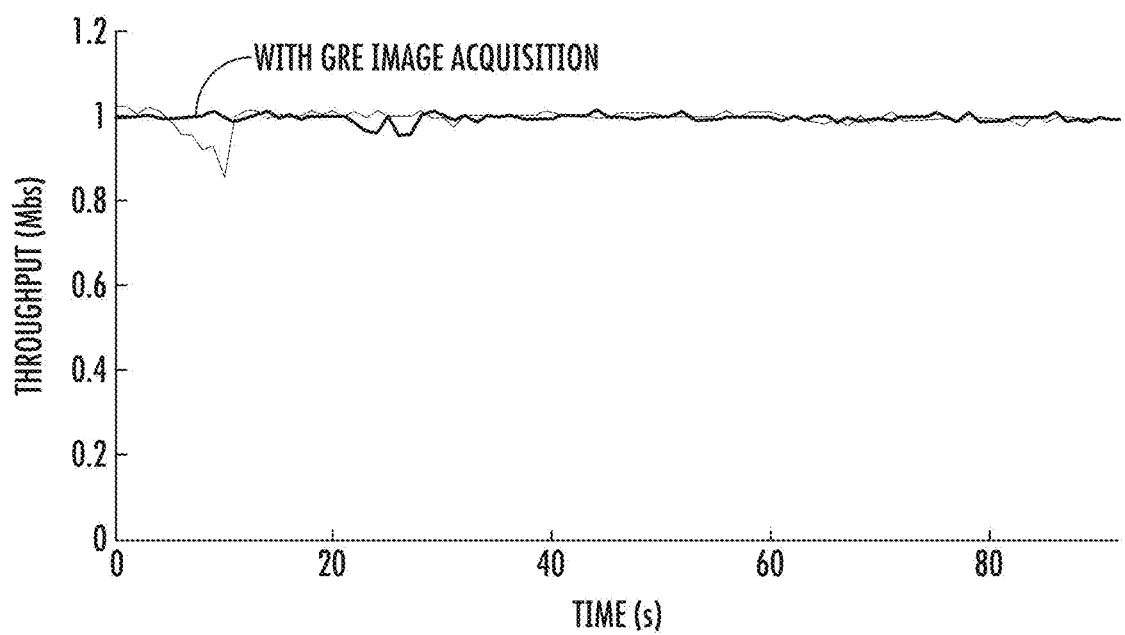
FIG. 16 is a graph of measured data throughput from the RF coil assembly to the AP comparing data throughput (Mbs) over time (seconds) with a GRE image acquisition and without the scanner running.

FIG. 16 is a graph of time (seconds) versus throughput (Mbs) for two conditions, for measured data throughput from the RF coil to the AP, one for data measured while a GRE image acquisition was performed (blue line) and the other without the scanner running.

Figure 18A:
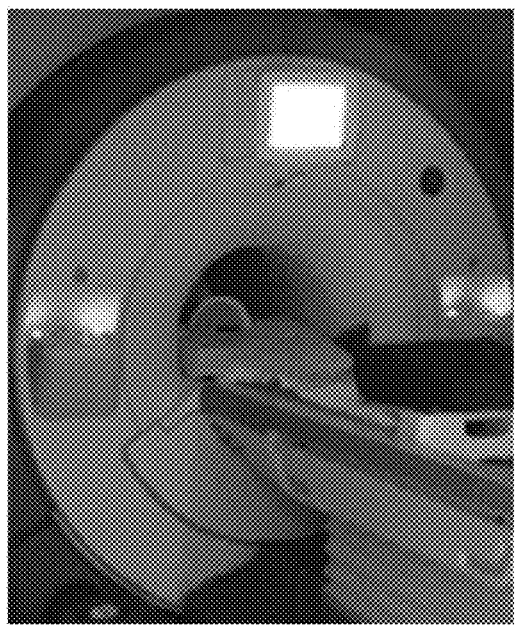
FIG. 18A and FIG. 18B are images of a scanner bore with an RF coil assembly having an onboard wireless module with an LED attached to a general purpose input/output on the wireless module.
Figure 18B:
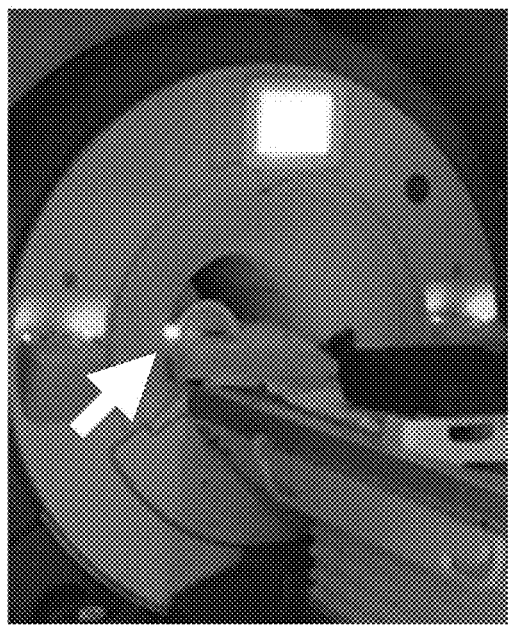

In the second experiment, a blue light emitting diode (LED) attached to the WiFi module GPIO was activated during the scan to demonstrate the ability to remotely control an on-board system via wireless data transfer from the AP to the coil. FIG. 18A and FIG. 18B are images of an RF coil with the wireless module and the LED in the bore of the magnet of the scanner showing the remote activation (FIG. 18B, arrow pointing to activated/ON LED) during a scan.

FIGS. 19A-19E are B0 maps. FIGS. 19F-19J are corresponding EPI images of the B0 maps of FIGS. 19A-19E. The figures demonstrate that the iPRES-W coil can shim and transmit wireless data simultaneously. The first row of B0 maps (FIGS. 19A-19E) show the MRI main magnetic field, B0, uniformity, +/−200 Hz color coded legend (green/primary color is considered perfectly uniform) for:

FIG. 19A baseline uniform phantom;
FIG. 19B after inhomogeneities have been introduced into the uniform phantom;
FIG. 19C the magnetic field that the iPRES-W coil generates to shim the inhomogeneities in the uniform phantom;
FIG. 19D the uniform phantom AFTER shimming has been performed, but WITHOUT wireless data transfer; and
FIG. 19E the uniform phantom AFTER shimming has been performed, but WITH wireless data transfer.
The EPI images (A-P, R-L) shown in FIGS. 19F-19J correspond to the same test as panels in FIGS. 19A-19E.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A Radio Frequency (RF) coil assembly for an MRI system, comprising:
   an RF coil array comprising a plurality of coil elements, the coil elements each comprising an RF conductor that defines an RF path, wherein the coil elements are configured to operate in an RF mode for at least one of transmitting RF excitation signals or receiving MRI image signals on the RF conductors; and
   at least one wireless module coupled to the RF coil array, the at least one wireless module comprising a wireless transceiver configured to operate in at least one wireless communication frequency band,
   wherein at least one coil element of the plurality of coil elements resonates at one or more resonant frequencies in the at least one wireless communication frequency band for data communication and also resonates at a Larmor frequency for transmitting the RF excitation signals and/or receiving the MRI image signals.

2. The RF coil assembly of claim 1, wherein the wireless transceiver has at least one antenna input connection and a plurality of general purpose input and output connections, and wherein the antenna input connection is coupled to the at least one coil element that resonates in the at least one wireless communication frequency band.

3. The RF coil assembly of claim 1, wherein the wireless transceiver provides input signals to and/or output signals from the at least one coil element that resonates in the at least one wireless communication frequency band for data communication and that also resonates at the Larmor frequency for transmitting the RF excitation signals and/or receiving the MRI image signals, wherein the input signals comprise data communication signals and/or the RF excitation signals, wherein the output signals comprise data communication signals and/or the MRI image signals, and wherein the RF coil assembly further comprises:
   first bandstop filters coupled to respective coil elements providing the input signals and/or the output signals, wherein a respective first bandstop filter resides between a corresponding coil element and the at least one wireless module adjacent a perimeter (phase plane) of the corresponding coil element, and wherein the first bandstop filters provide an open electrical circuit at the Larmor frequency.

4. The RF coil assembly of claim 1, wherein the RF coil assembly further comprises first and second bandstop filters attached to the coil elements that resonate in the at least one wireless communication frequency band, wherein the second bandstop filters provide an impedance that is matched to a pre-amplifier impedance of a pre-amplifier connected to a respective coil element at a first RF connection associated with an MRI feed port at the Larmor frequency, and wherein the first bandstop filters provide a high impedance at an operational frequency of the second bandstop filter at a second RF connection associated with a wireless data feed port at the at least one wireless communication frequency band.

5. The RF coil array assembly of claim 1, wherein the wireless transceiver comprises a plurality of general purpose input and output connections, at least one of the general purpose input and output connections is coupled to at least one peripheral device and is configured to provide at least one control signal for the at least one peripheral device.

6. The RF coil assembly of claim 1, wherein the at least one wireless module comprises a plurality of general purpose input and output connections that are coupled to a direct current (DC) power supply and at least some of the plurality of coil elements for providing DC current for $B_0$ shimming.

7. The RF coil assembly of claim 6, wherein at least some of the plurality of coil elements comprise an MR-compatible switch to adaptively adjust a number of DC loops within a respective coil element, and wherein the coil elements with the switch are electrically connected to general purpose input and output (GPIO) connections of the transceiver of the at least one wireless module.

8. The RF coil assembly of claim 1, wherein the at least one wireless module is a single wireless module with a single wireless transceiver coupled to the RF coil array, and wherein the plurality of coil elements are provided in a range from 2 to 512.

9. The RF coil assembly of claim 1, wherein the at least one wireless module is a plurality of wireless modules, each comprising a respective wireless transceiver, wherein different wireless transceivers are coupled to different subsets of the plurality of coil elements.

10. The RF coil assembly of claim 1, wherein the at least one wireless module is a plurality of wireless modules with respective wireless transceivers, one wireless module for each coil element of the plurality of coil elements.

11. The RF coil assembly of claim 1, further comprising a battery module with a plurality of rechargeable non-ferromagnetic batteries connected to the at least one wireless module and at least some of the plurality of the coil elements, wherein at least some of the RF conductors of the at least some of the plurality of the coil elements are further configured to generate one or more direct current (DC) loops.

12. The RF coil assembly of claim 1, wherein the at least one coil element that resonates at one or more resonant frequencies in the at least one wireless communication frequency band for data communication and that also resonates at the Larmor frequency for transmitting the RF excitation signals and/or receiving the MRI image signals is arranged as a plurality of different coil elements, wherein the at least one wireless module is coupled to the plurality of different coil elements, and wherein the different coil elements define a Multiple Input, Multiple Output configuration.

13. The RF coil assembly of claim 1, wherein the plurality of coil elements of the RF coil array are configured as a first subset of the plurality of coil elements and a second subset of the plurality of coil elements, wherein the at least one coil element that resonates at one or more resonant frequencies in the at least one wireless communication frequency band for data communication and that also resonates at the Larmor frequency for transmitting the RF excitation signals and/or receiving the MRI image signals is configured as the first subset of coil elements, and wherein the second subset of the coil elements (a) only transmit the RF excitation signals, (b) only receive the MRI image signals or (c) transmit the RF excitation signals and receive the MRI image signals.

14. The RF coil assembly of claim 1, wherein the wireless transceiver of the at least one wireless module comprises a plurality of general purpose input and output ports, and wherein one or more of the general purpose input and output ports are connected to a DC power supply and to one or more of the plurality of coil elements to thereby provide a DC control voltage and/or DC shimming current to the one or more coil elements.

15. The RF coil assembly of claim 1, wherein the wireless transceiver is an LTE or WiFi transceiver.

16. The RF coil assembly of claim 1, wherein the at least one wireless transceiver comprises an 802.11b/g WiFi transceiver, wherein the at least one wireless transceiver comprises general purpose input output (GPIO) connections, wherein a first plurality of the plurality of coil elements are input channels that are configured for providing RF excitation signals at the Larmor frequency and/or data communication in the at least one wireless communication frequency band from the transceiver, and wherein a second different plurality of the plurality of coil elements are output channels that are configured for providing MRI image signals at the Larmor frequency and/or data communication in the at least one wireless communication frequency band to the transceiver.

17. The RF coil assembly of claim 1, wherein the at least one wireless module is a single wireless module with a single wireless transceiver that is the wireless transceiver and that is attached to the RF coil array.

18. A Magnetic Resonance Imaging (MRI) system, comprising the RF coil assembly of claim 1;
an MRI scanner with a magnet providing a magnetic field in a scanner room of an MRI suite; and
at least one dipole antenna spaced apart from the at least one wireless module, wherein the at least one dipole antenna is in communication with a wireless access point (WAP) and is coupled to the at least one wireless module.

19. The system of claim 18, wherein the at least one dipole antenna is in the scanner room and is configured to directly receive the wireless data from the at least one wireless module of the RF coil array and transmit the wireless data through a filter to the WAP outside the scanner room.

20. The system of claim 1, wherein the wireless transceiver is configured to wirelessly transmit to a dipole antenna communication data with MRI signal data packets obtained from the at least one coil element in real time or near real time as to when MRI image signal data is obtained.

21. A method of operating an Magnetic Resonance Imaging (MRI) system, comprising:
providing a Radio Frequency (RF) coil array assembly with a plurality of coil elements and at least one wireless module with a wireless transceiver with general purpose input and output (GPIO) connections, the at least one wireless module connected to at least some of the coil elements;
concurrently flowing RF currents at Larmor and wireless communication data transmission frequencies on at least some of the coil elements; and
directly wirelessly transmitting MRI RF signal and wireless communication data from the wireless module to at least one dipole antenna that is outside a bore of a magnet in a scanner room of an MRI scanner suite.

22. The method of claim 21, further comprising using one or more of the GPIO connections to wirelessly deliver a control signal to a peripheral device and/or a direct current power supply.

23. The method of claim 21, further comprising electrically isolating first and second RF ports of at least some of the plurality of coil elements using first and second bandstop filters, and connecting an antenna connection of the transceiver of the wireless module to at least some of the coil elements with a respective first bandstop filter positioned adjacent a perimeter (phase plane) of a respective coil element, between the coil element and the antenna connection of the transceiver.

24. The method of claim 21, further comprising operating the RF coil assembly in at least one of an RF transmit or receive mode;
- flowing DC current through separate DC current loops of each respective coil element concurrently with the transmit or receive mode and the concurrently flowing of the RF currents at the Larmor and wireless data transmission frequencies; and
- generating local $B_0$ magnetic fields in response to the flow of the DC current through the DC current loops, thereby $B_0$ shimming an imaging space of a magnet of the MR system using the generated local $B_0$ magnetic fields.

25. The method of claim 24, further comprising providing DC current for generating the local $B_0$ magnetic fields in the DC current loops from a battery module comprising rechargeable non-ferromagnetic batteries, at least some of the rechargeable non-ferromagnetic batteries in communication with GPIO connections of the wireless module.

26. The method of claim 24, wherein a single wireless transceiver communicates with a sub-set of the coil elements and the subset of coil elements are connected to one or more antenna connections of the transceiver, wherein each of the subset of coil elements comprise a respective first bandstop filter positioned between the antenna connection and a perimeter (phase plane) of the coil element.

27. The method of claim 21, further comprising transmitting a DC control input to a sensor or switch held by a respective coil element or the RF coil assembly using a GPIO connection of the transceiver of the wireless module.

28. The method of claim 21, wherein the wireless transceiver of the wireless module operates in a LTE or WiFi frequency band.

29. A battery module for an RF coil assembly of an MRI system, comprising:
- a substrate;
- at least one rechargeable, non-ferromagnetic battery held on the substrate; and
- a wireless module comprising a transceiver held on the substrate electrically coupled to the at least one rechargeable battery,
- wherein the battery module is configured to couple to the RF coil assembly of the MRI system, and wherein the substrate comprises a printed circuit board, and wherein the at least one rechargeable, non-ferromagnetic battery is a plurality of rechargeable non-ferromagnetic batteries all electrically connected to the wireless module.

30. The battery module of claim 29, wherein the wireless module comprises at least one antenna connection and a plurality of general purpose input and output (GPIO) connections, and wherein at least some of the plurality of GPIO connections are electrically connected to the rechargeable batteries.

31. The battery module of claim 30, further comprising a plurality of switches in electrical communication with the GPIO connections and the rechargeable batteries.

32. The battery module of claim 30, further comprising a plurality of op amps, programmable resistors and a digital to analog converter held on the substrate in communication with the rechargeable batteries.

33. The battery module of claim 29, further comprising an electrical connection interface coupled to the wireless module and the rechargeable batteries, wherein the electrical connection interface is coupled to an external, non-ferromagnetic connector that comprises a plurality of DC power connections and at least one RF connection.

34. The battery module of claim 29, coupled to a Radio Frequency (RF) coil assembly for an MRI system, the RF coil assembly comprising:
- an RF coil array comprising a plurality of coil elements, the coil elements each comprising an RF conductor that defines an RF path, wherein the coil elements are configured to operate in an RF mode for at least one of transmitting RF excitation signals or receiving MRI image signals on the RF conductors; and
- wherein the transceiver is a wireless transceiver configured to operate in at least one wireless communication frequency band,
- wherein at least one coil element of the plurality of coil elements resonates at one or more resonant frequencies in the at least one wireless communication frequency band and also concurrently resonates at a Larmor frequency for transmitting the RF excitation signals and/or for receiving the MRI image signals.

\* \* \* \* \*

UNITED STATES PATENT AND TRADEMARK OFFICE
CERTIFICATE OF CORRECTION

| | |
|---|---|
| PATENT NO. | : 10,948,557 B2 |
| APPLICATION NO. | : 16/489862 |
| DATED | : March 16, 2021 |
| INVENTOR(S) | : Darnell et al. |

Page 1 of 1

It is certified that error appears in the above-identified patent and that said Letters Patent is hereby corrected as shown below:

In the Specification

Column 6, Line 61: Please correct "MM Scanner" to read -- MRI Scanner --

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*